(12) United States Patent
Lin et al.

(10) Patent No.: US 11,107,836 B2
(45) Date of Patent: Aug. 31, 2021

(54) SEMICONDUCTOR DEVICE STRUCTURE AND METHOD FOR FORMING THE SAME

(71) Applicant: Taiwan Semiconductor Manufacturing Co., Ltd., Hsinchu (TW)

(72) Inventors: Zhi-Chang Lin, Zhubei (TW); Chun-Hsiung Lin, Zhubei (TW); Chih-Hao Wang, Baoshan Township, Hsinchu County (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 1 day.

(21) Appl. No.: 16/571,751

(22) Filed: Sep. 16, 2019

(65) Prior Publication Data

US 2021/0082966 A1 Mar. 18, 2021

(51) Int. Cl.
*H01L 29/66* (2006.01)
*H01L 27/12* (2006.01)
*H01L 21/308* (2006.01)
*H01L 29/06* (2006.01)
*H01L 29/78* (2006.01)

(52) U.S. Cl.
CPC ...... *H01L 27/1211* (2013.01); *H01L 21/3086* (2013.01); *H01L 29/0649* (2013.01); *H01L 29/6681* (2013.01); *H01L 29/66795* (2013.01); *H01L 29/7831* (2013.01); *H01L 29/7853* (2013.01)

(58) Field of Classification Search
None
See application file for complete search history.

(56) References Cited

U.S. PATENT DOCUMENTS

| 9,209,247 | B2 | 12/2015 | Colinge et al. |
| 9,236,267 | B2 | 1/2016 | De et al. |
| 9,412,817 | B2 | 8/2016 | Yang et al. |
| 9,412,828 | B2 | 8/2016 | Ching et al. |
| 9,472,618 | B2 | 10/2016 | Oxland |
| 9,502,265 | B1 | 11/2016 | Jiang et al. |
| 9,520,482 | B1 | 12/2016 | Chang et al. |
| 9,536,738 | B2 | 1/2017 | Huang et al. |
| 9,576,814 | B2 | 2/2017 | Wu et al. |
| 9,608,116 | B2 | 3/2017 | Ching et al. |
| 2015/0340457 | A1* | 11/2015 | Xie ............... H01L 29/6681 257/288 |
| 2019/0067444 | A1* | 2/2019 | Ching ........... H01L 21/823807 |

* cited by examiner

*Primary Examiner* — Grant S Withers
(74) *Attorney, Agent, or Firm* — McClure, Qualey & Rodack, LLP

(57) ABSTRACT

A method for forming a semiconductor device structure is provided. The method includes forming a first gate stack over a substrate. The substrate has a base and a first fin structure over the base, and the first gate stack wraps around a first upper portion of the first fin structure. The method includes partially removing the first fin structure, which is not covered by the first gate stack. The method includes forming a first mask layer over a first sidewall of the first fin structure. The method includes forming a first stressor over a second sidewall of the first fin structure while the first mask layer covers the first sidewall. The first sidewall is opposite to the second sidewall. The method includes removing the first mask layer. The method includes forming a dielectric layer over the base and the first stressor. The dielectric layer covers the first sidewall.

20 Claims, 39 Drawing Sheets

SEMICONDUCTOR DEVICE STRUCTURE AND METHOD FOR FORMING THE SAME

BACKGROUND

The semiconductor integrated circuit (IC) industry has experienced rapid growth. Technological advances in IC materials and design have produced generations of ICs. Each generation has smaller and more complex circuits than the previous generation. However, these advances have increased the complexity of processing and manufacturing ICs.

In the course of IC evolution, functional density (i.e., the number of interconnected devices per chip area) has generally increased while geometric size (i.e., the smallest component (or line) that can be created using a fabrication process) has decreased. This scaling-down process generally provides benefits by increasing production efficiency and lowering associated costs.

However, since feature sizes continue to decrease, fabrication processes continue to become more difficult to perform. Therefore, it is a challenge to form reliable semiconductor devices at smaller and smaller sizes.

BRIEF DESCRIPTION OF THE DRAWINGS

Aspects of the present disclosure are best understood from the following detailed description when read with the accompanying figures. It should be noted that, in accordance with standard practice in the industry, various features are not drawn to scale. In fact, the dimensions of the various features may be arbitrarily increased or reduced for clarity of discussion.

FIG. 1E-1 is a cross-sectional view illustrating the semiconductor device structure along a sectional line I-I' in FIG. 1E, in accordance with some embodiments.

FIG. 1F-1 is a cross-sectional view illustrating the semiconductor device structure along a sectional line I-I' in FIG. 1F, in accordance with some embodiments.

FIG. 1G-1 is a top view of the semiconductor device structure of FIG. 1G, in accordance with some embodiments.

FIG. 1G-2 is a cross-sectional view illustrating the semiconductor device structure along a sectional line I-I' in FIG. 1G-1, in accordance with some embodiments.

FIG. 1G-3 is a cross-sectional view illustrating the semiconductor device structure along a sectional line II-II' in FIG. 1G-1, in accordance with some embodiments.

FIG. 1H-1 is a top view of the semiconductor device structure of FIG. 1H, in accordance with some embodiments.

FIG. 1H-2 is a cross-sectional view illustrating the semiconductor device structure along a sectional line I-I' in FIG. 1H-1, in accordance with some embodiments.

FIG. 1H-3 is a cross-sectional view illustrating the semiconductor device structure along a sectional line II-II' in FIG. 1H-1, in accordance with some embodiments.

FIG. 1J-1 is a perspective view of a portion of the semiconductor device structure of FIG. 1J, in accordance with some embodiments.

FIG. 1K-1 is a perspective view of a portion of the semiconductor device structure of FIG. 1K, in accordance with some embodiments.

FIG. 1L-1 is a cross-sectional view illustrating the semiconductor device structure along a sectional line I-I' in FIG. 1L, in accordance with some embodiments.

FIG. 1M-1 is a cross-sectional view illustrating the semiconductor device structure along a sectional line I-I' in FIG. 1M, in accordance with some embodiments.

FIG. 1M-2 is a cross-sectional view illustrating the semiconductor device structure along a sectional line II-II' in FIG. 1M, in accordance with some embodiments.

FIG. 2 is a cross-sectional view of a stage of a process for forming a semiconductor device structure, in accordance with some embodiments.

FIG. 3 is a cross-sectional view of a semiconductor device structure, in accordance with some embodiments.

FIG. 7C-1 is a cross-sectional view illustrating the semiconductor device structure along a sectional line I-I' in FIG. 7C, in accordance with some embodiments.

FIG. 7D-1 is a cross-sectional view illustrating the semiconductor device structure along a sectional line I-I' in FIG. 7D, in accordance with some embodiments.

DETAILED DESCRIPTION

Figure 1A:
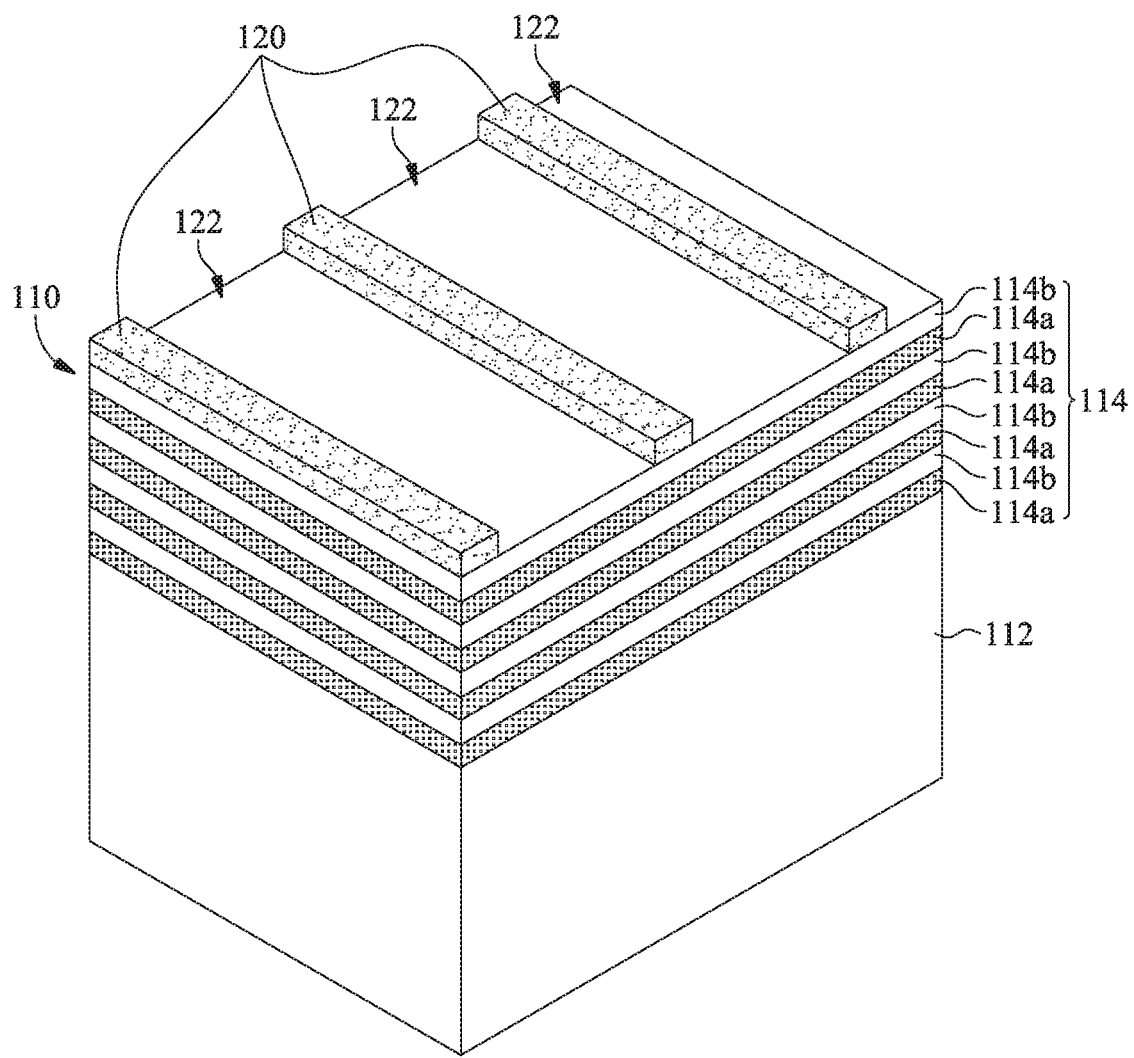
FIGS. 1A-1M are perspective views of various stages of a process for forming a semiconductor device structure, in accordance with some embodiments.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Furthermore, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. It should be understood that additional operations can be provided before, during, and after the method, and some of the operations described can be replaced or eliminated for other embodiments of the method.

Some embodiments of the disclosure are described. Additional operations can be provided before, during, and/or after the stages described in these embodiments. Some of the stages that are described can be replaced or eliminated for different embodiments. Additional features can be added to the semiconductor device structure. Some of the features described below can be replaced or eliminated for different embodiments. Although some embodiments are discussed with operations performed in a particular order, these operations may be performed in another logical order.

Embodiments of the disclosure form a semiconductor device structure with FinFETs. The fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins.

The gate all around (GAA) transistor structures may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the GAA structure.

FIGS. 1A-1M are perspective views of various stages of a process for forming a semiconductor device structure, in accordance with some embodiments. As shown in FIG. 1A, a substrate 110 is provided, in accordance with some embodiments. The substrate 110 includes a lower portion 112 and a multilayer structure 114, in accordance with some embodiments. The multilayer structure 114 is formed over the lower portion 112, in accordance with some embodiments.

The lower portion 112 includes, for example, a semiconductor substrate. The semiconductor substrate includes, for example, a semiconductor wafer (such as a silicon wafer) or a portion of a semiconductor wafer. In some embodiments, the lower portion 112 is made of an elementary semiconductor material including silicon or germanium in a single crystal, polycrystal, or amorphous structure.

In some other embodiments, the lower portion 112 is made of a compound semiconductor, such as silicon carbide, gallium arsenide, gallium phosphide, indium phosphide, indium arsenide, an alloy semiconductor, such as SiGe, or GaAsP, or a combination thereof. The lower portion 112 may also include multi-layer semiconductors, semiconductor on insulator (SOI) (such as silicon on insulator or germanium on insulator), or a combination thereof.

In some embodiments, the lower portion 112 is a device wafer that includes various device elements. In some embodiments, the various device elements are formed in and/or over the lower portion 112. The device elements are not shown in figures for the purpose of simplicity and clarity. Examples of the various device elements include active devices, passive devices, other suitable elements, or a combination thereof. The active devices may include transistors or diodes (not shown). The passive devices include resistors, capacitors, or other suitable passive devices.

For example, the transistors may be metal oxide semiconductor field effect transistors (MOSFET), complementary metal oxide semiconductor (CMOS) transistors, bipolar junction transistors (BJT), high-voltage transistors, high-frequency transistors, p-channel and/or n-channel field effect transistors (PFETs/NFETs), etc. Various processes, such as front-end-of-line (FEOL) semiconductor fabrication processes, are performed to form the various device elements. The FEOL semiconductor fabrication processes may include deposition, etching, implantation, photolithography, annealing, planarization, one or more other applicable processes, or a combination thereof.

In some embodiments, isolation features (not shown) are formed in the lower portion 112. The isolation features are used to define active regions and electrically isolate various device elements formed in and/or over the lower portion 112 in the active regions. In some embodiments, the isolation features include shallow trench isolation (STI) features, local oxidation of silicon (LOCOS) features, other suitable isolation features, or a combination thereof.

The multilayer structure 114 includes sacrificial layers 114a and channel layers 114b, in accordance with some embodiments. The sacrificial layers 114a and the channel layers 114b are alternately arranged as illustrated in FIG. 1A, in accordance with some embodiments. It should be noted that, for the sake of simplicity, FIG. 1A shows four layers of the sacrificial layers 114a and four layers of the channel layers 114b for illustration, but does not limit the invention thereto. In some embodiments, the number of the sacrificial layers 114a or the channel layers 114b is between 2 and 10.

The sacrificial layers 114a are made of a first material, such as a first semiconductor material, in accordance with some embodiments. The channel layers 114b are made of a second material, such as a second semiconductor material, in accordance with some embodiments.

The first material is different from the second material, in accordance with some embodiments. The first material has an etch selectivity with respect to the second material, in accordance with some embodiments. In some embodiments, the sacrificial layers 114a are made of SiGe, and the channel layers 114b are made of Si.

In some other embodiments, the sacrificial layers 114a or the channel layers 114b are made of other materials such as germanium, a compound semiconductor such as silicon carbide, gallium arsenide, gallium phosphide, indium phosphide, indium arsenide, and/or indium antimonide, an alloy semiconductor such as GaAsP, AlInAs, AlGaAs, InGaAs, GaInP, and/or GaInAsP, or combinations thereof.

The channel layers 114b and the lower portion 112 are made of the same material such as Si, and the sacrificial layers 114a and the lower portion 112 are made of different materials, in accordance with some embodiments. In some other embodiments, the sacrificial layers 114a, the channel layers 114b, and the lower portion 112 are made of different materials, in accordance with some embodiments.

The sacrificial layers 114a and the channel layers 114b are formed using a molecular beam epitaxy (MBE) process, a metal-organic chemical vapor deposition (MOCVD) process, and/or another suitable epitaxial growth process.

As shown in FIG. 1A, a mask layer 120 is formed over the multilayer structure 114, in accordance with some embodiments. The mask layer 120 has trenches 122, in accordance with some embodiments. The trenches 122 expose portions of the substrate 110 (or the multilayer structure 114), in accordance with some embodiments.

The mask layer 120 is made of an oxide material such as silicon dioxide (SiO$_2$), a nitride material such as silicon nitride (Si$_3$N$_4$), or another suitable material, which is different from the materials of the substrate 110 (or the multilayer structure 114), in accordance with some embodiments. The mask layer 120 is formed using a deposition process (e.g., a physical vapor deposition process or a chemical vapor deposition process), a photolithography process, and an etching process (e.g., a dry etching process), in accordance with some embodiments.

Figure 1B:
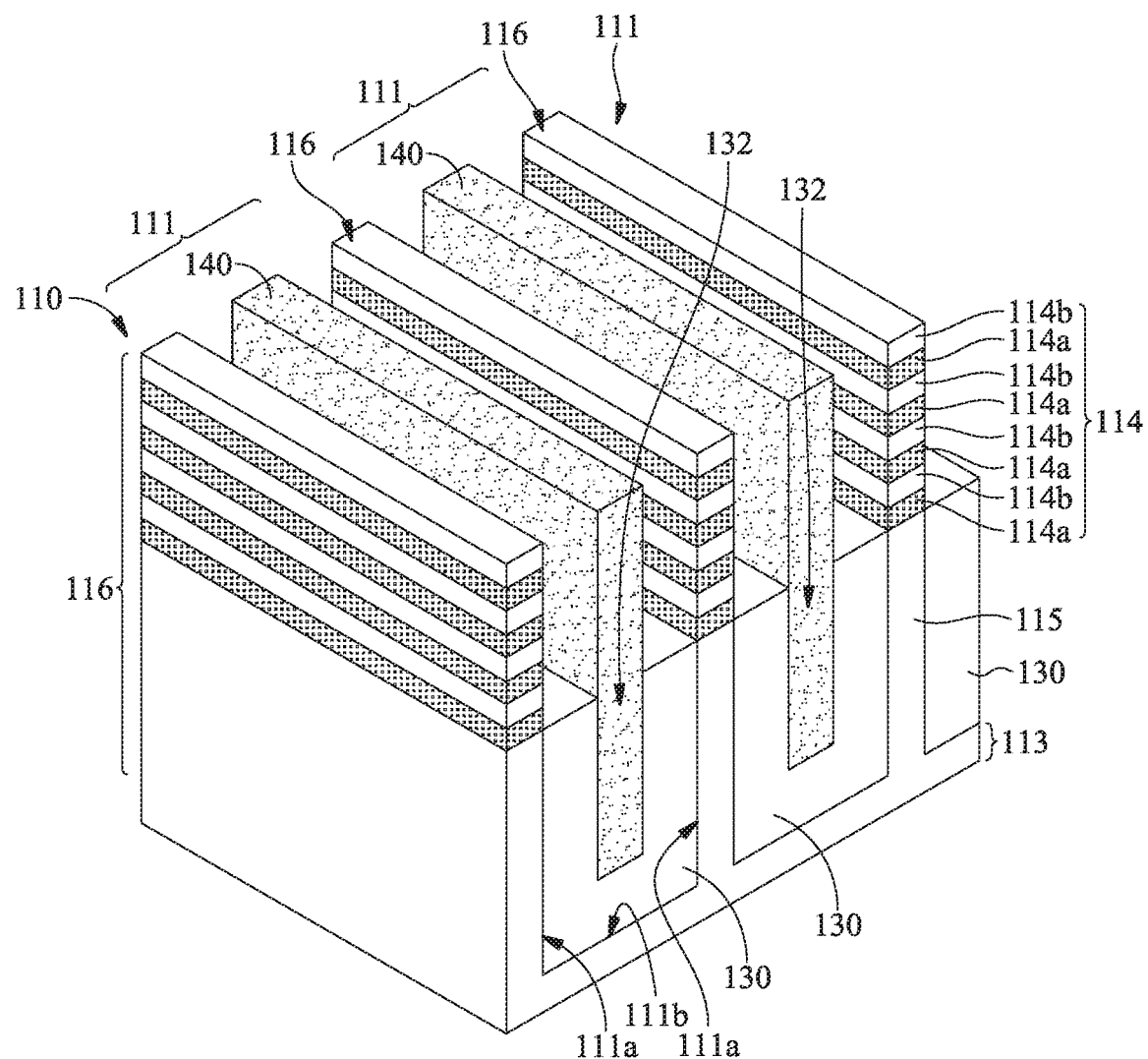

As shown in FIGS. 1A and 1B, the portions of the substrate 110 exposed by the trenches 122 are removed through the trenches 122, in accordance with some embodiments. The removal process forms trenches 111 in the substrate 110, in accordance with some embodiments.

After the removal process, the remaining portion of the substrate 110 includes a base 113 and fin structures 116, in accordance with some embodiments. The fin structures 116 are over the base 113, in accordance with some embodiments. The base 113 is formed from the lower portion 112 (as shown in FIG. 1A), in accordance with some embodiments.

Each fin structure 116 includes a bottom portion 115 and a portion of the multilayer structure 114, which includes the sacrificial layers 114$a$ and the channel layers 114$b$, in accordance with some embodiments. That is, each fin structure 116 includes portions of the sacrificial layers 114$a$ and the channel layers 114$b$, in accordance with some embodiments. The bottom portion 115 is formed from the lower portion 112 (as shown in FIG. 1A), in accordance with some embodiments. The fin structures 116 are separated from each other by the trenches 111, in accordance with some embodiments.

Thereafter, as shown in FIGS. 1A and 1B, the mask layer 120 is removed, in accordance with some embodiments. As shown in FIG. 1B, a dielectric layer 130 and dielectric fins 140 are formed in the trenches 111, in accordance with some embodiments. The dielectric layer 130 conformally covers inner walls 111$a$ and bottom surfaces 111$b$ of the trenches 111, in accordance with some embodiments.

The dielectric layer 130 has trenches 132 respectively in the trenches 111, in accordance with some embodiments. The dielectric fins 140 are respectively formed in the trenches 132, in accordance with some embodiments. Each dielectric fin 140 extends out of the corresponding trench 132, in accordance with some embodiments.

The dielectric layer 130 is made of oxide (such as silicon oxide), fluorosilicate glass (FSG), a low-k dielectric material, and/or another suitable dielectric material. The dielectric fins 140 are made of oxide (e.g., silicon oxide), nitride (e.g., silicon nitride, silicon carbon nitride, silicon oxycarbon nitride, titanium nitride, or tantalum nitride), carbide (e.g., silicon oxycarbide), metal oxide (e.g., oxides of Li, Be, Mg, Ca, Sr, Sc, Y, Zr, Al, La, Ce, Pr, Nd, Sm, Eu, Gd, Tb, Dy, Ho, Hf, Er, Tm, Yb, Lu, and/or mixtures thereof), or another suitable insulating material, in accordance with some embodiments.

In some embodiments, the dielectric layer 130 and the dielectric fins 140 are made of different materials with different etching rates under an etchant. The removal of the mask layer 120 and the formation of the dielectric layer 130 and the dielectric fins 140 includes: conformally depositing a dielectric material layer (not shown) over the substrate 110, wherein the dielectric material layer in the trenches 111 has trenches 132; depositing a dielectric fin material layer over the dielectric material layer to fill the trenches 132; performing a planarization process to remove the dielectric material layer and the dielectric fin material layer outside of the trenches 111 and the mask layer 120; and performing a selective etching process to remove an upper portion of the dielectric material layer, wherein the remaining dielectric material layer forms the dielectric layer 130, and the remaining dielectric fin material layer forms the dielectric fins 140.

The dielectric material layer (or the dielectric layer 130) may be deposited by an atomic layer deposition (ALD) process, a chemical vapor deposition (CVD) process, or another applicable process. The dielectric fin material layer (or the dielectric fins 140) may be deposited by a chemical vapor deposition process, an atomic layer deposition process, a physical vapor deposition (PVD) process, or another applicable process.

Figure 1C:
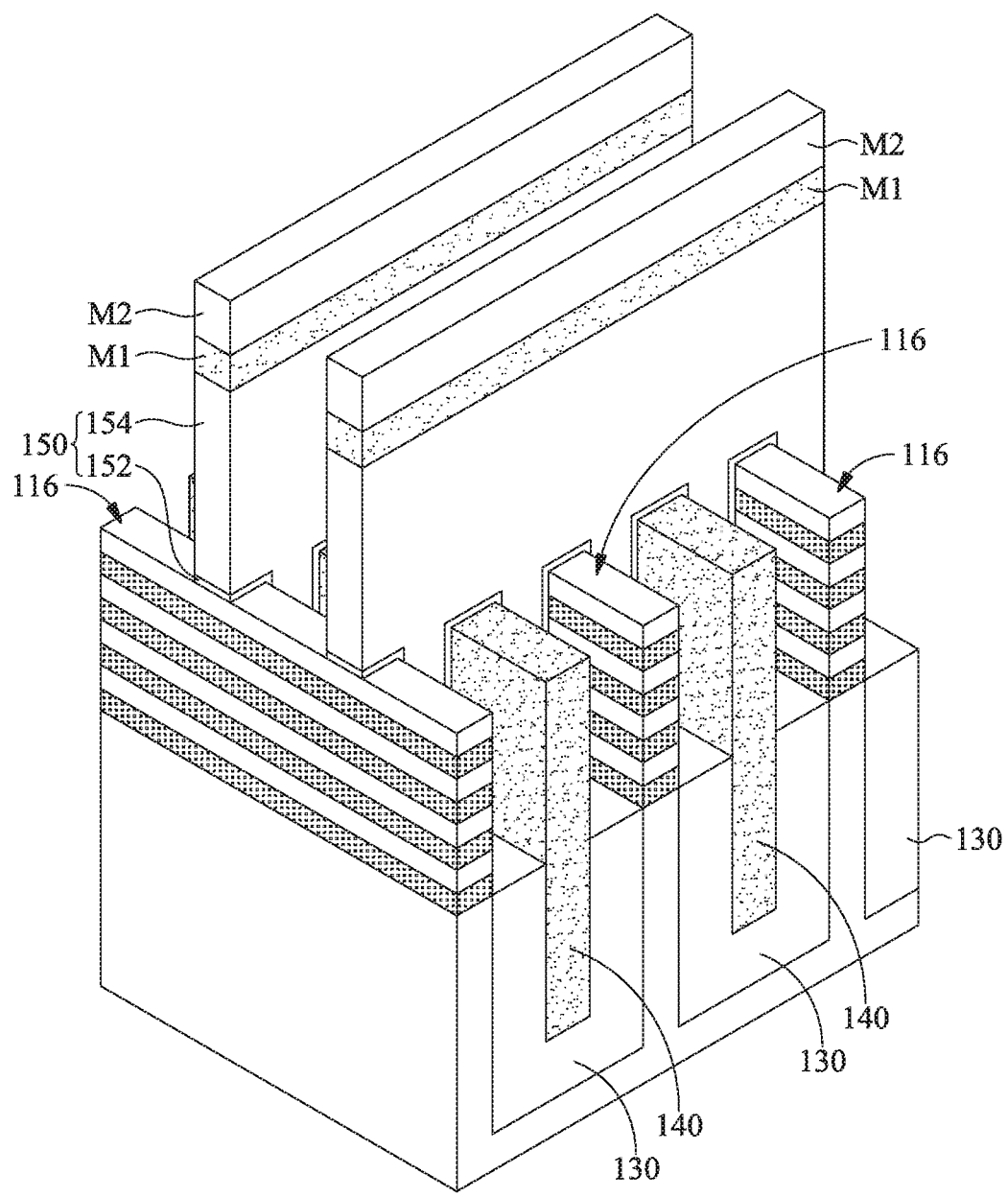

As shown in FIG. 1C, gate stacks 150 and mask layers M1 and M2 are formed over the fin structures 116, the dielectric layer 130, and the dielectric fins 140, in accordance with some embodiments. Each gate stack 150 includes a gate dielectric layer 152 and a gate electrode 154, in accordance with some embodiments. The gate dielectric layer 152, the gate electrode 154, and the mask layers M1 and M2 are sequentially stacked over the fin structures 116, in accordance with some embodiments.

The gate dielectric layer 152 conformally covers the fin structures 116, the dielectric layer 130, and the dielectric fins 140, in accordance with some embodiments. The gate dielectric layer 152 is made of an insulating material, such as oxide (e.g., silicon oxide), in accordance with some embodiments. The gate electrode 154 is made of a semiconductor material (e.g. polysilicon) or a conductive material (e.g., metal or alloy), in accordance with some embodiments.

The formation of the gate dielectric layer 152 and the gate electrode 154 includes: depositing a gate dielectric material layer (not shown) over the fin structures 116, the dielectric layer 130, and the dielectric fins 140; depositing a gate electrode material layer (not shown) over the gate dielectric material layer; sequentially forming the mask layers M1 and M2 over the gate electrode material layer, wherein the mask layers M1 and M2 expose portions of the gate electrode material layer; and removing the exposed portions of the gate electrode material layer and the gate dielectric material layer thereunder, in accordance with some embodiments.

In some embodiments, the mask layer M1 serves a buffer layer or an adhesion layer that is formed between the underlying gate electrode 154 and the overlying mask layer M2. The mask layer M1 may also be used as an etch stop layer when the mask layer M2 is removed or etched.

In some embodiments, the mask layer M1 is made of an oxide-containing insulating material (e.g., silicon oxide), a nitride-containing insulating material (e.g., silicon nitride, silicon carbide, silicon oxynitride, silicon oxycarbonitride, or silicon carbonitride), or a metal oxide material (e.g., aluminum oxide).

In some embodiments, the mask layer M1 is formed by a deposition process, such as a chemical vapor deposition (CVD) process, a low-pressure chemical vapor deposition (LPCVD) process, a plasma enhanced chemical vapor deposition (PECVD) process, a high-density plasma chemical vapor deposition (HDPCVD) process, a spin-on process, or another applicable process.

In some embodiments, the mask layer M2 is made of an oxide-containing insulating material (e.g., silicon oxide), a nitride-containing insulating material (e.g., silicon nitride, silicon oxynitride, silicon oxycarbonitride, or silicon carbonitride), silicon carbide, or a metal oxide material (e.g., aluminum oxide). The mask layers M1 and M2 are made of different materials, in accordance with some embodiments.

In some embodiments, the mask layer M2 is formed by a deposition process, such as a chemical vapor deposition (CVD) process, a low-pressure chemical vapor deposition (LPCVD) process, a plasma enhanced chemical vapor deposition (PECVD) process, a high-density plasma chemical vapor deposition (HDPCVD) process, a spin-on process, or another applicable process.

After the formation of the mask layer M1 and the mask layer M2, the mask layer M1 and the overlying mask layer M2 are patterned by a photolithography process and an etching process, so as to expose the portions of the gate electrode material layer.

Figure 1D:
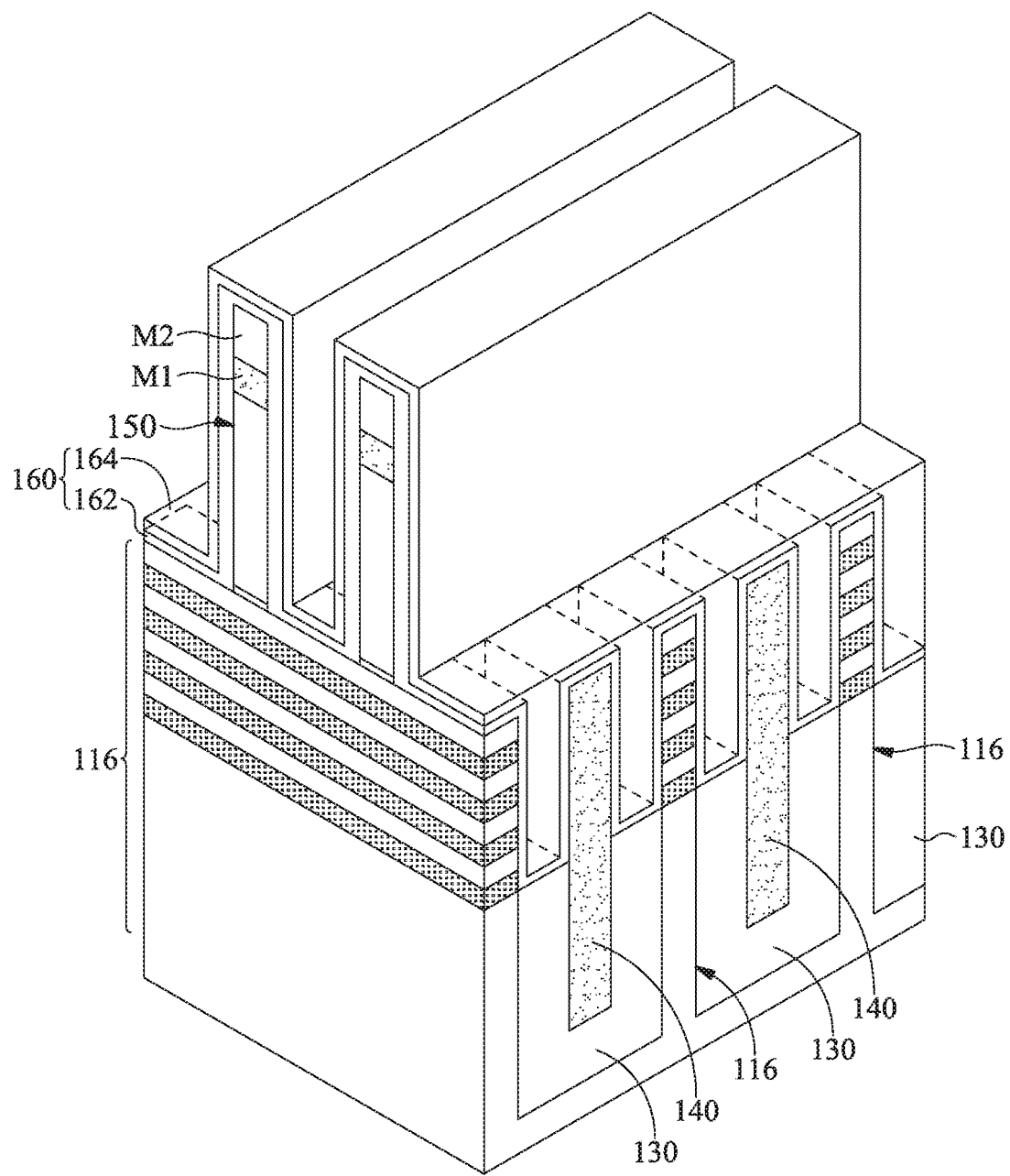

As shown in FIG. 1D, a spacer layer 160 is formed over the fin structures 116, the dielectric layer 130, the dielectric fins 140, the gate stacks 150, and the mask layers M1 and M2, in accordance with some embodiments. In some embodiments, as shown in FIG. 1D, the spacer layer 160 is a multi-layered structure.

The spacer layer 160 includes layers 162 and 164, in accordance with some embodiments. The layer 164 is over the layer 162, in accordance with some embodiments. The layers 162 and 164 are made of different materials, in accordance with some embodiments. In some other embodiments (not shown), the spacer layer 160 is a single-layered structure.

In some embodiments, the layer 162 or 164 is made of an oxide-containing insulating material, such as silicon oxide. In some other embodiments, the layer 162 or 164 is made of a nitride-containing insulating material, such as silicon nitride (SiN), silicon oxynitride (SiON), silicon oxycarbonitride (SiOCN), or silicon carbonitride (SiCN). The layers 162 and 164 are formed using a deposition process, such as a chemical vapor deposition (CVD) process, an atomic layer deposition (ALD) process, or a physical vapor deposition (PVD) process, in accordance with some embodiments.

Figure 1E:
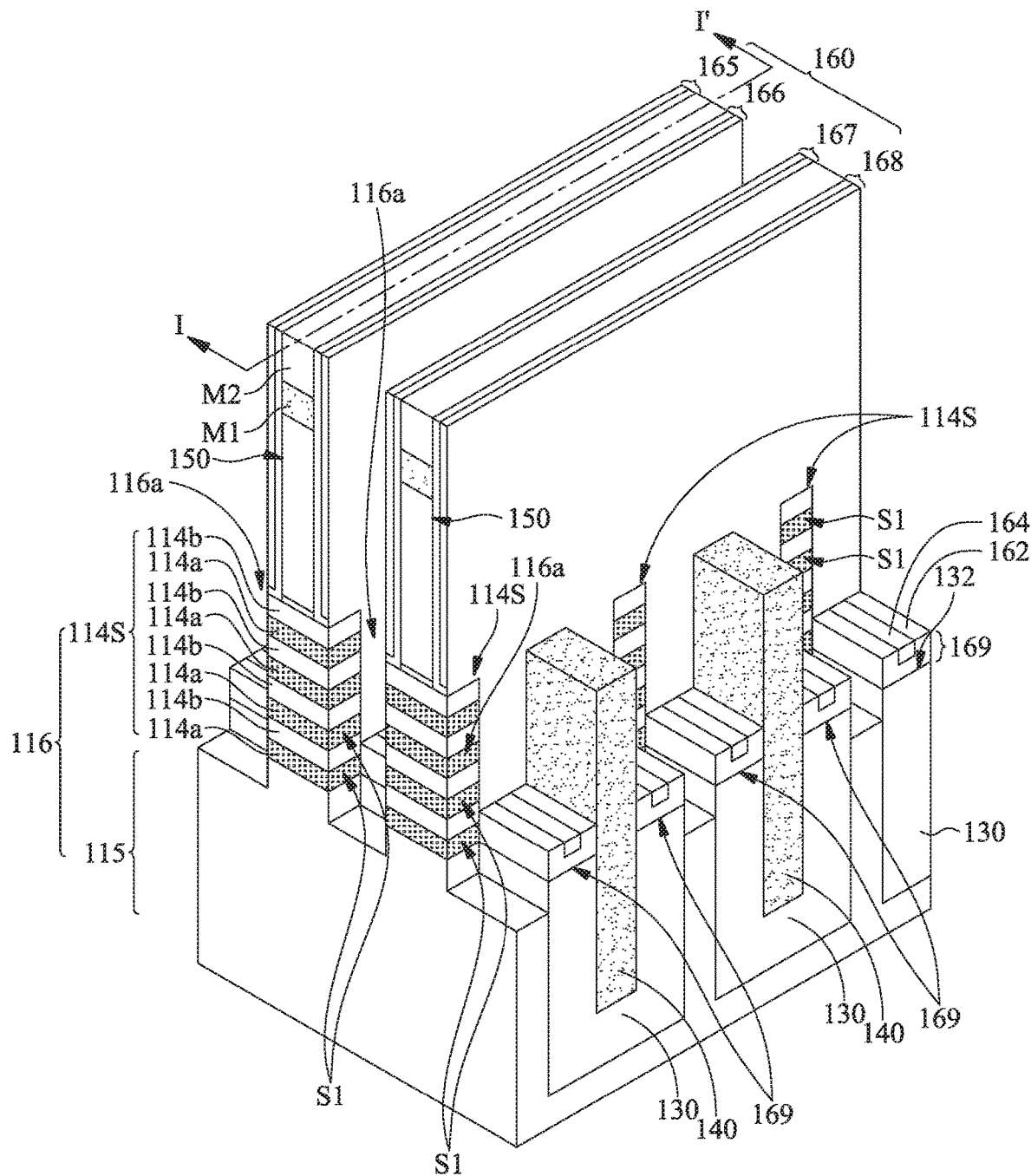

As shown in FIG. 1E, portions of the spacer layer 160 and upper portions of the fin structures 116, which are not covered by the gate stacks 150 and the spacer layer 160 over sidewalls of the gate stacks 150, are removed, in accordance with some embodiments. After the removal process, the spacer layer 160 remains over opposite sidewalls of the gate stacks 150, opposite sidewalls of the mask layers M1 and M2, and the top surfaces 132 of the dielectric layer 130, in accordance with some embodiments.

The spacer layer 160 remaining over the opposite sidewalls of the gate stacks 150 and the opposite sidewalls of the mask layers M1 and M2 forms spacers 165, 166, 167, and 168, in accordance with some embodiments. The spacer layer 160 remaining over the top surfaces 132 of the dielectric layer 130 forms spacers 169, in accordance with some embodiments.

The removal process forms recesses 116a in the fin structures 116, in accordance with some embodiments. Each multilayer structure 114 is divided into multilayer stacks 114S by the recesses 116a, in accordance with some embodiments. Each multilayer stack 114S includes four layers of the sacrificial layers 114a and four layers of the channel layers 114b, in accordance with some embodiments.

Figures 1, 1E:
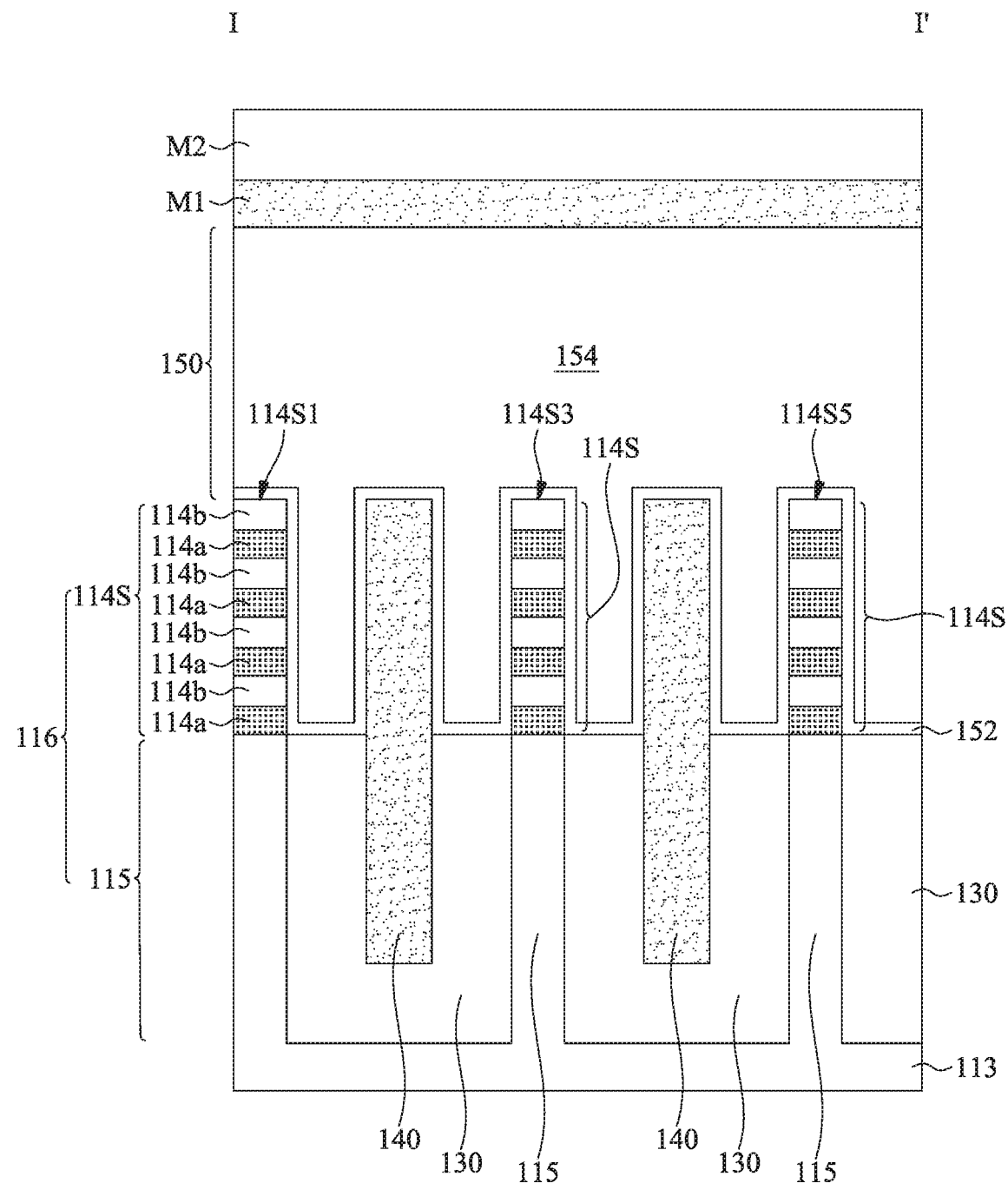

FIG. 1E-1 is a cross-sectional view illustrating the semiconductor device structure along a sectional line I-I' in FIG. 1E, in accordance with some embodiments. As shown in FIGS. 1E and 1E-1, each gate stack 150 wraps around three of the multilayer stacks 114S, in accordance with some embodiments. The removal process for forming the recesses 116a includes an etching process, such as an anisotropic etching process (e.g., a dry etching process), in accordance with some embodiments.

Figure 1F:
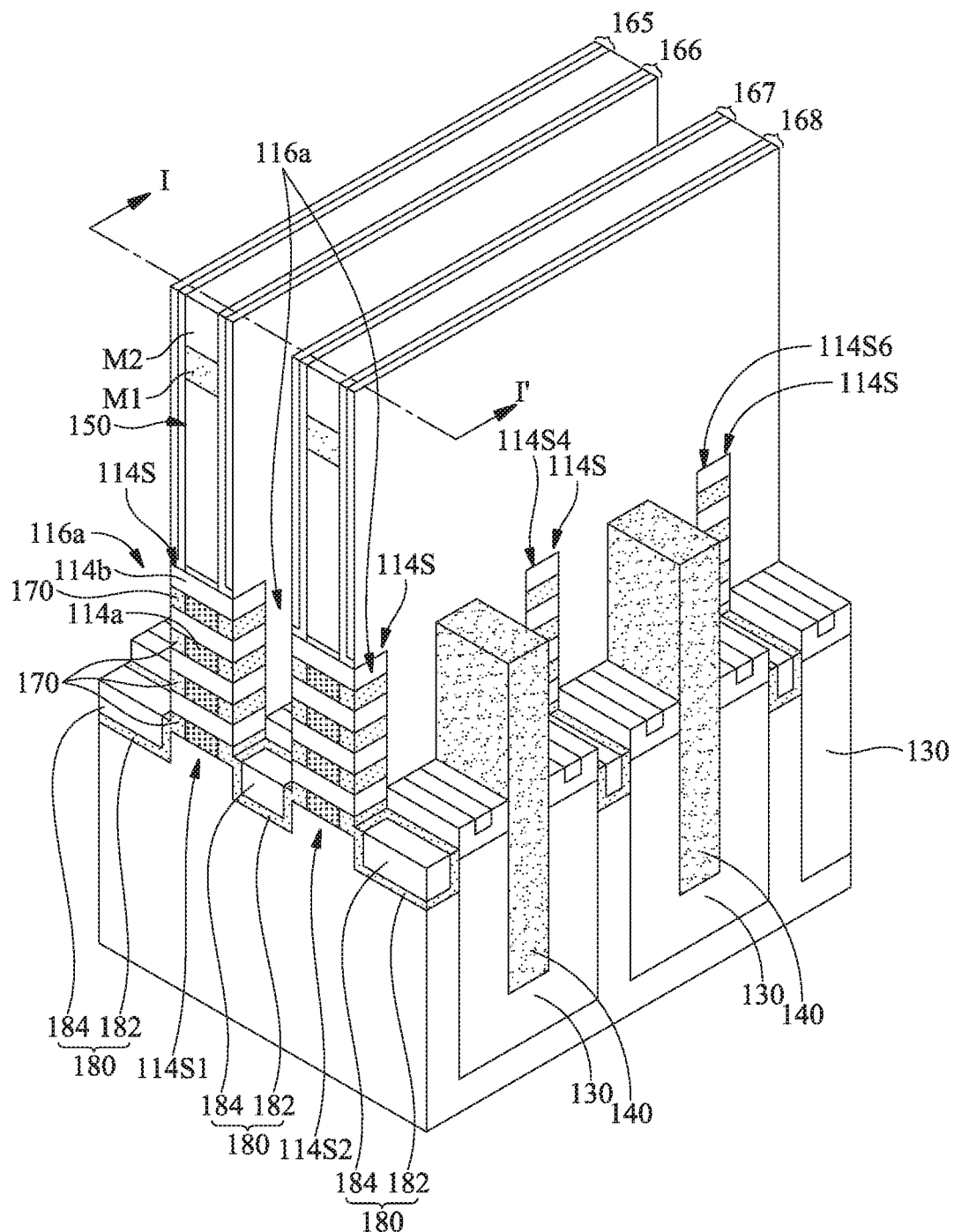
Figures 1, 1F:
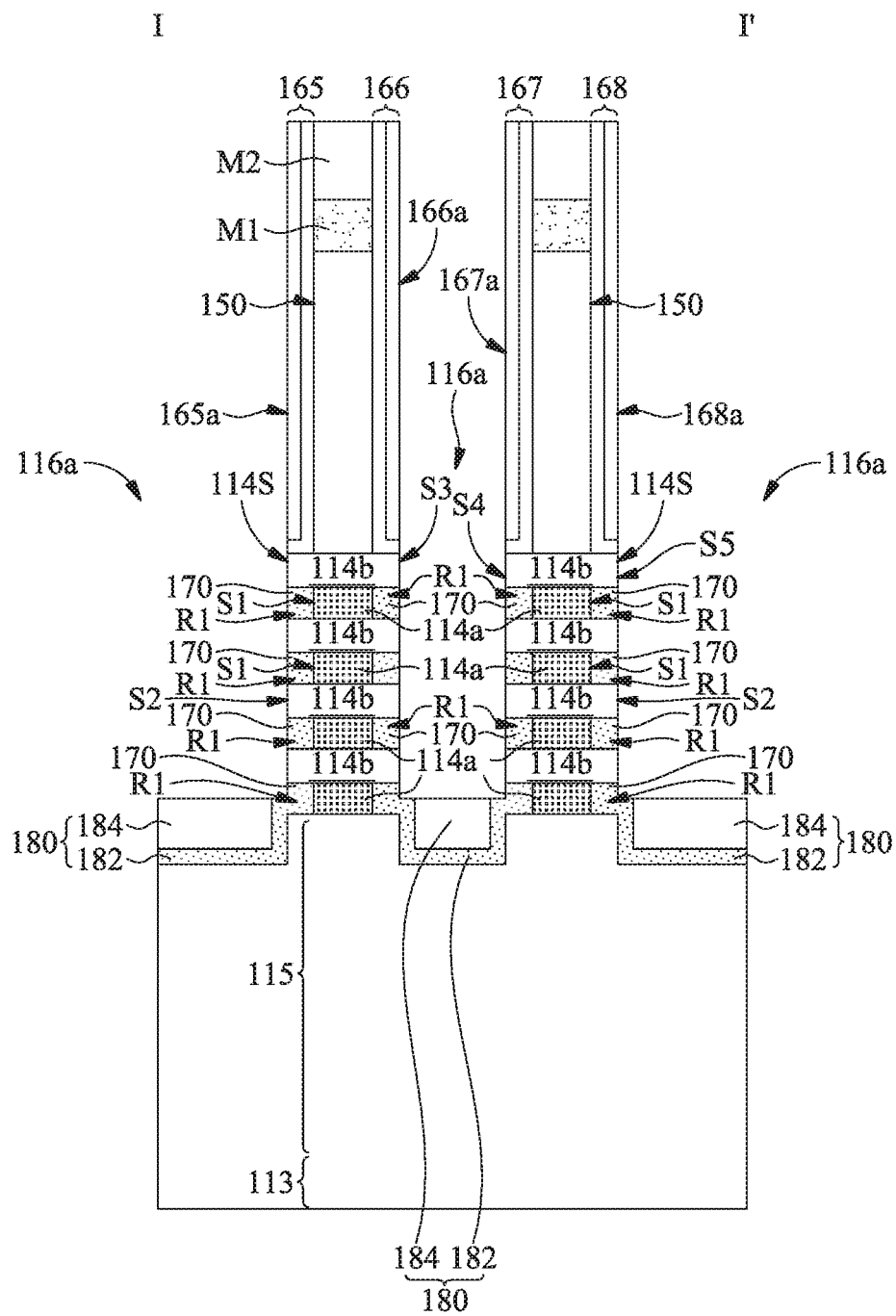

FIG. 1F-1 is a cross-sectional view illustrating the semiconductor device structure along a sectional line I-I' in FIG. 1F, in accordance with some embodiments. As shown in FIGS. 1E, 1F, and 1F-1, portions of the sacrificial layers 114a are removed from sidewalls S1 of the sacrificial layers 114a to form recesses R1 in the multilayer stacks 114S, in accordance with some embodiments. Each recess R1 is surrounded by the corresponding sacrificial layer 114a and the corresponding channel layers 114b, in accordance with some embodiments. The removal process includes an etching process, such as an isotropic etching process (e.g., a dry etching process or a wet etching process), in accordance with some embodiments.

As shown in FIG. 1F, inner spacers 170 and bottom spacers 180 are respectively formed in the recesses R1 and 116a, in accordance with some embodiments. Each bottom spacer 180 includes layers 182 and 184, in accordance with some embodiments. The layer 184 is over the layer 182, in accordance with some embodiments. The layer 182 and the inner spacers 170 are formed from the same spacer material layer and therefore are made of the same material, in accordance with some embodiments.

The layers 182 and 184 are made of different materials, in accordance with some embodiments. In some embodiments, the layer 182 or 184 or the inner spacers 170 are made of an oxide-containing insulating material, such as silicon oxide. In some other embodiments, the layer 182 or 184 or the inner spacers 170 are made of a nitride-containing insulating material, such as silicon nitride (SiN), silicon oxynitride (SiON), silicon oxycarbonitride (SiOCN), or silicon carbonitride (SiCN).

Figure 1G:
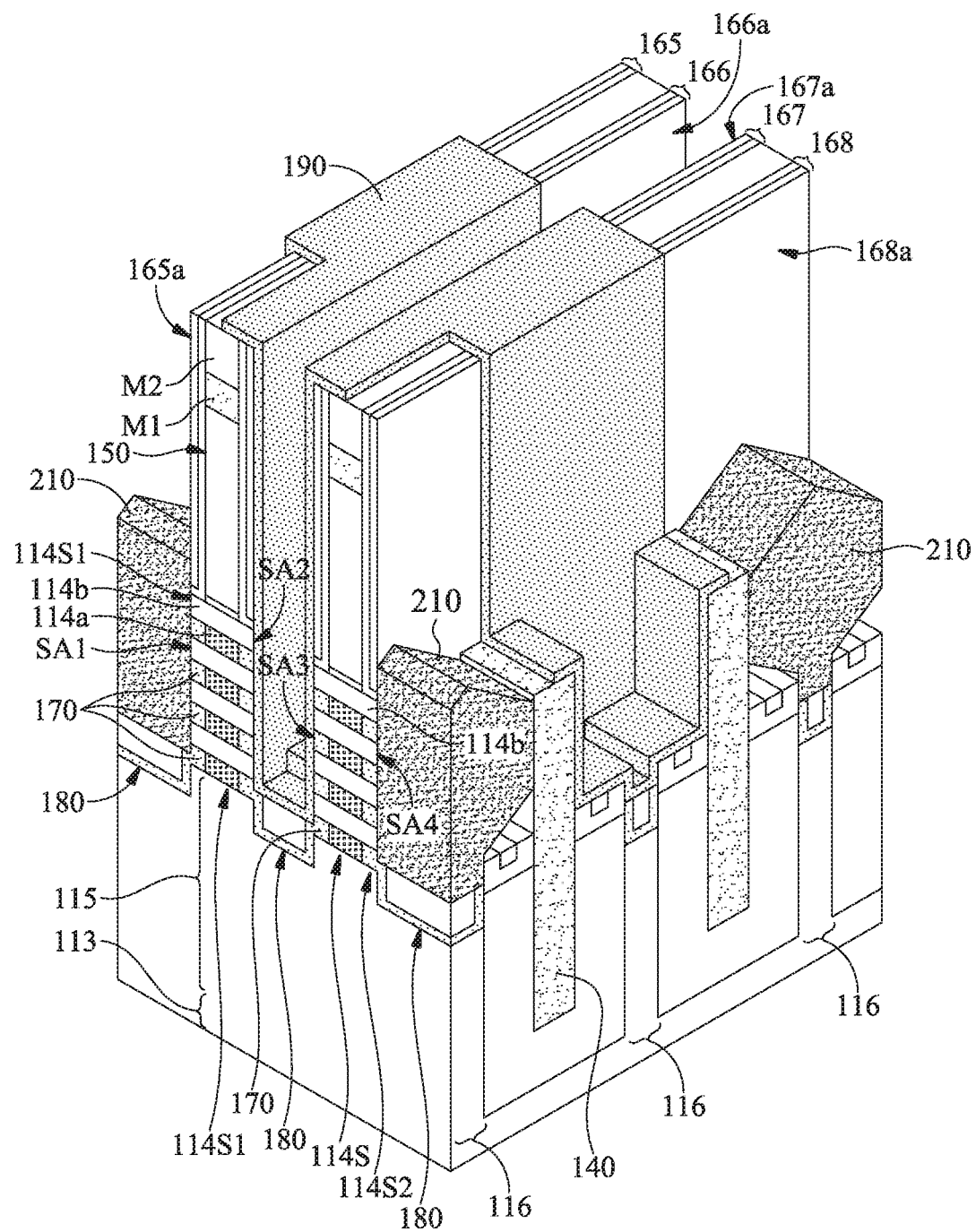
Figures 1, 1G:
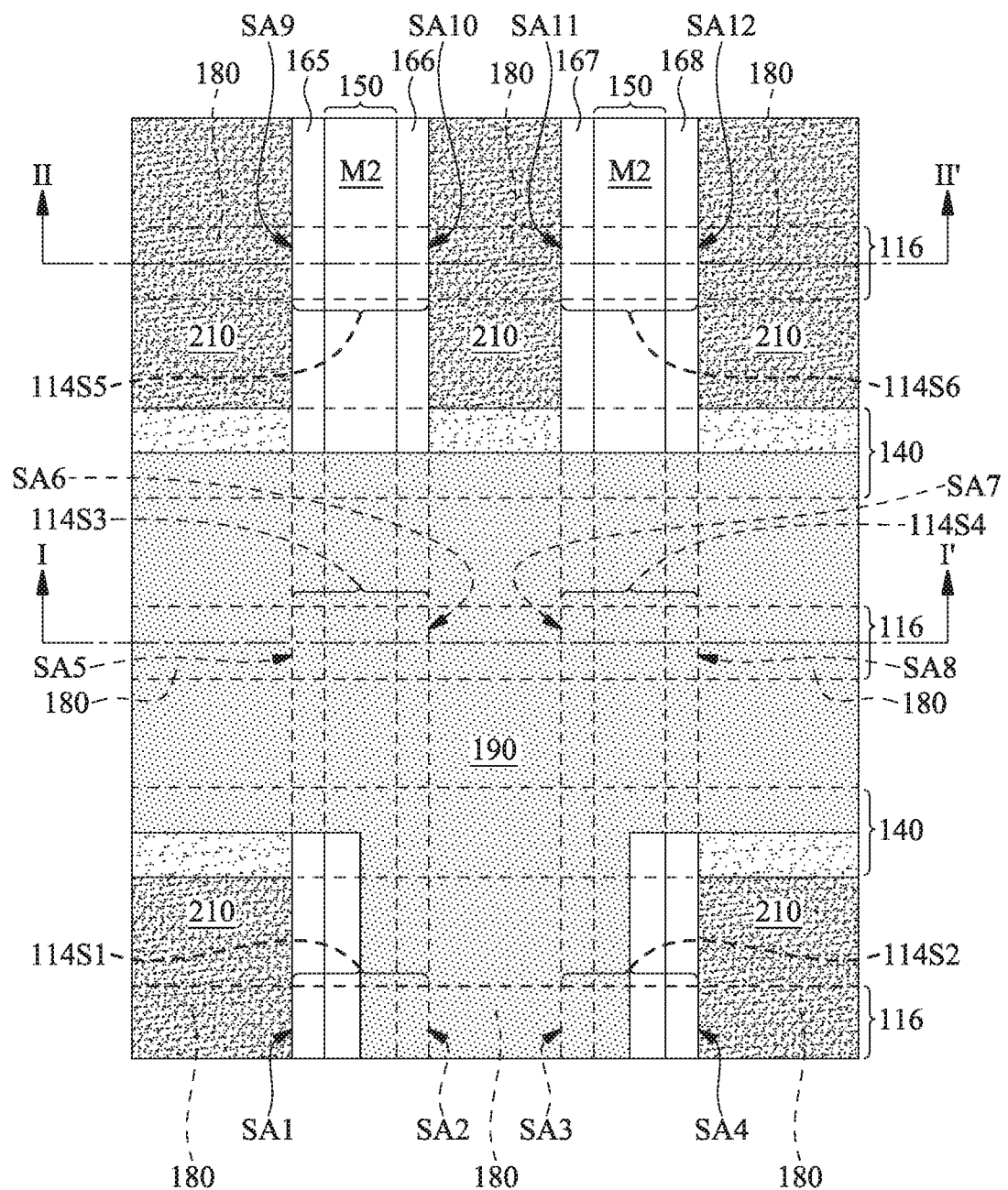
Figures 1, 1G, 2:
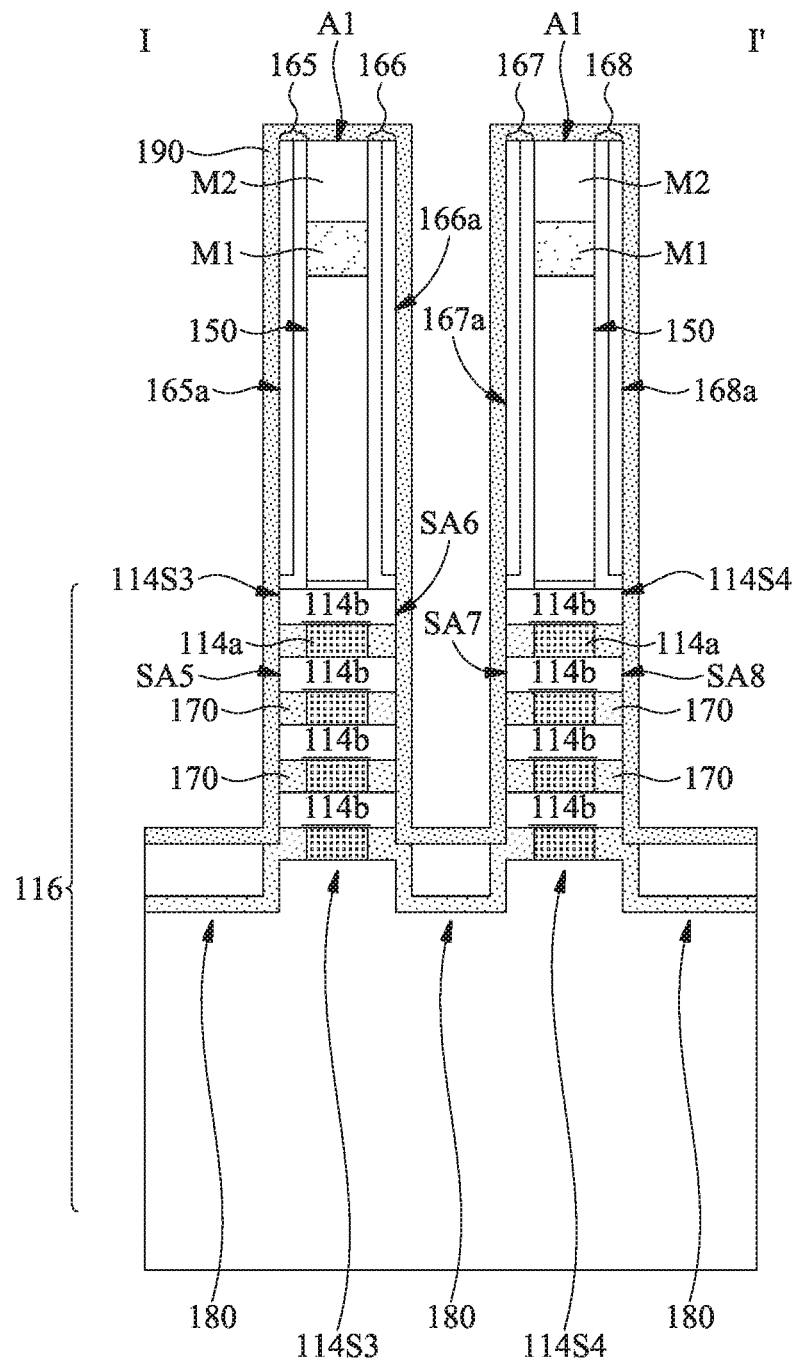

The formation of the inner spacers 170 and the bottom spacers 180 includes: depositing a spacer material layer 202 (as shown in FIG. 2) over the multilayer stacks 114S, the bottom portions 115, the gate stacks 150, the mask layers M1 and M2, and the spacers 165, 166, 167, and 168, wherein the spacer material layer 202 fills the recesses R1, and the spacer material layer 202 has trenches 212 over and in the recesses 116a; filling the layer 184 into the trenches 212 (as shown in FIG. 2); and performing an etching back process to remove portions of the spacer material layer 202 and the layer 184 so as to form the inner spacers 170 and the bottom spacers 180 (as shown in FIG. 1F-1), in accordance with some embodiments. As shown in FIGS. 1F-1 and 2, the inner spacers 170 and the layer 182 of each bottom spacer 180 are formed from the spacer material layer 202, in accordance with some embodiments. The etching back process includes an isotropic etching process, in accordance with some embodiments.

As shown in FIG. 1F-1, sidewalls S2, S3, S4, and S5 of the channel layers 114b are respectively and substantially coplanar with sidewalls 165a, 166a, 167a, and 168a of the spacers 165, 166, 167, and 168, in accordance with some embodiments.

FIG. 1G-1 is a top view of the semiconductor device structure of FIG. 1G, in accordance with some embodiments. FIG. 1G-2 is a cross-sectional view illustrating the semiconductor device structure along a sectional line I-I' in FIG. 1G-1, in accordance with some embodiments.

As shown in FIGS. 1G, 1G-1, and 1G-2, a mask layer 190 is formed over portions of sidewalls of the fin structures 116, in accordance with some embodiments. Specifically, the mask layer 190 covers portions of sidewalls of the multilayer stacks 114S of the fin structures 116, in accordance with some embodiments.

As shown in FIGS. 1E-1, 1F, and 1G-1, the multilayer stacks 114S includes multilayer stacks 114S1, 114S2, 114S3, 114S4, 114S5, and 114S6, in accordance with some embodiments. The multilayer stack 114S1 has opposite sidewalls SA1 and SA2, in accordance with some embodiments. The multilayer stack 114S2 has opposite sidewalls SA3 and SA4, in accordance with some embodiments.

The multilayer stack 114S3 has opposite sidewalls SA5 and SA6, in accordance with some embodiments. The multilayer stack 114S4 has opposite sidewalls SA7 and SA8, in accordance with some embodiments. The multilayer stack 114S5 has opposite sidewalls SA9 and SA10, in accordance with some embodiments. The multilayer stack 114S6 has opposite sidewalls SA11 and SA12, in accordance with some embodiments.

As shown in FIGS. 1G, 1G-1, and 1G-2, the mask layer 190 covers the sidewall SA2 of the multilayer stack 114S1, the sidewall SA3 of the multilayer stack 114S2, the sidewalls SA5 and SA6 of the multilayer stack 114S3, and the sidewalls SA7 and SA8 of the multilayer stack 114S4, in accordance with some embodiments. The mask layer 190 is used to prevent stressors, which are formed in subsequent processes, from being formed over the sidewalls SA2, SA3, SA5, SA6, SA7 and SA8, in accordance with some embodiments.

As shown in FIGS. 1G, 1G-1, and 1G-2, the mask layer 190 continuously covers the bottom spacer 180 adjacent to the sidewall SA5, the sidewall SA5 of the multilayer stack 114S3, the sidewall 165a of the spacer 165, the top surface A1 of the mask layer M2, the sidewall 166a of the spacer 166, the sidewall SA6 of the multilayer stack 114S3, the sidewall SA2 of the multilayer stack 114S1, the bottom spacer 180 between the multilayer stacks 114S3 and 114S4, the bottom spacer 180 between the multilayer stacks 114S1 and 114S2, the sidewall SA7 of the multilayer stack 114S4, the sidewall SA3 of the multilayer stack 114S2, the sidewall 167a of the spacer 167, the sidewall 168a of the spacer 168, the sidewall SA8 of the multilayer stack 114S4, and the bottom spacer 180 adjacent to the sidewall SA8, in accordance with some embodiments.

The mask layer 190 is made of a nitride-containing material, such as silicon nitride, an oxide containing material, such as silicon oxide, a metal oxide material, or another suitable material, which is different from the materials of the spacers 165, 166, 167, and 168, the bottom spacers 180, the mask layer M2, and the multilayer stacks 114S, in accordance with some embodiments.

The mask layer 190 is formed using a deposition process, a photolithography process, and an etching process, in accordance with some embodiments. The deposition process includes a chemical vapor deposition process or a physical vapor deposition process, in accordance with some embodiments.

FIG. 1G-3 is a cross-sectional view illustrating the semiconductor device structure along a sectional line II-II' in FIG. 1G-1, in accordance with some embodiments. As shown in FIGS. 1G, 1G-1, and 1G-3, stressors 210 are formed over the sidewall SA1 of the multilayer stack 114S1, the sidewall SA4 of the multilayer stack 114S2, the sidewalls SA9 and SA10 of the multilayer stack 114S5, and the sidewalls SA11 and SA12 of the multilayer stack 114S6, in accordance with some embodiments. As shown in FIGS. 1G and 1G-1, the stressor 210 over the sidewall SA1 is in direct contact with the channel layers 114b of the multilayer stack 114S1 and the inner spacers 170 in the multilayer stack 114S1, in accordance with some embodiments.

As shown in FIGS. 1G and 1G-1, the stressor 210 over the sidewall SA4 is in direct contact with the channel layers 114b of the multilayer stack 114S2 and the inner spacers 170 in the multilayer stack 114S2, in accordance with some embodiments. As shown in FIGS. 1G-1 and 1G-3, the stressor 210 over the sidewall SA9 is in direct contact with the channel layers 114b of the multilayer stack 114S5 and the inner spacers 170 in the multilayer stack 114S5, in accordance with some embodiments.

As shown in FIGS. 1G-1 and 1G-3, the stressor 210 over the sidewalls SA10 and SA11 is in direct contact with the channel layers 114b of the multilayer stacks 114S5 and 114S6 and the inner spacers 170 in the multilayer stacks 114S5 and 114S6, in accordance with some embodiments. As shown in FIGS. 1G-1 and 1G-3, the stressor 210 over the sidewall SA12 is in direct contact with the channel layers 114b of the multilayer stack 114S6 and the inner spacers 170 in the multilayer stack 114S6, in accordance with some embodiments.

As shown in FIGS. 1G and 1G-1, the stressors 210 are positioned over the corresponding bottom spacers 180, in accordance with some embodiments. The bottom spacers 180 electrically insulate the stressors 210 thereover from the bottom portions 115 of the fin structures 116 and the base 113, in accordance with some embodiments. As shown in FIG. 1G, the multilayer stack 114S1 and a lower portion of the gate stack 150 are between the stressor 210 and the mask layer 190, in accordance with some embodiments.

In some embodiments, the stressors 210 are made of a semiconductor material (e.g., silicon germanium) with P-type dopants, such as the Group IIIA element, in accordance with some embodiments. The Group IIIA element includes boron or another suitable material.

In some other embodiments, the stressors 210 are made of a semiconductor material (e.g., silicon) with N-type dopants, such as the Group VA element, in accordance with some embodiments. The Group VA element includes phosphor (P), antimony (Sb), or another suitable Group VA material. The stressors 210 are formed using an epitaxial process, in accordance with some embodiments.

Figures 1, 1G, 2, 3:
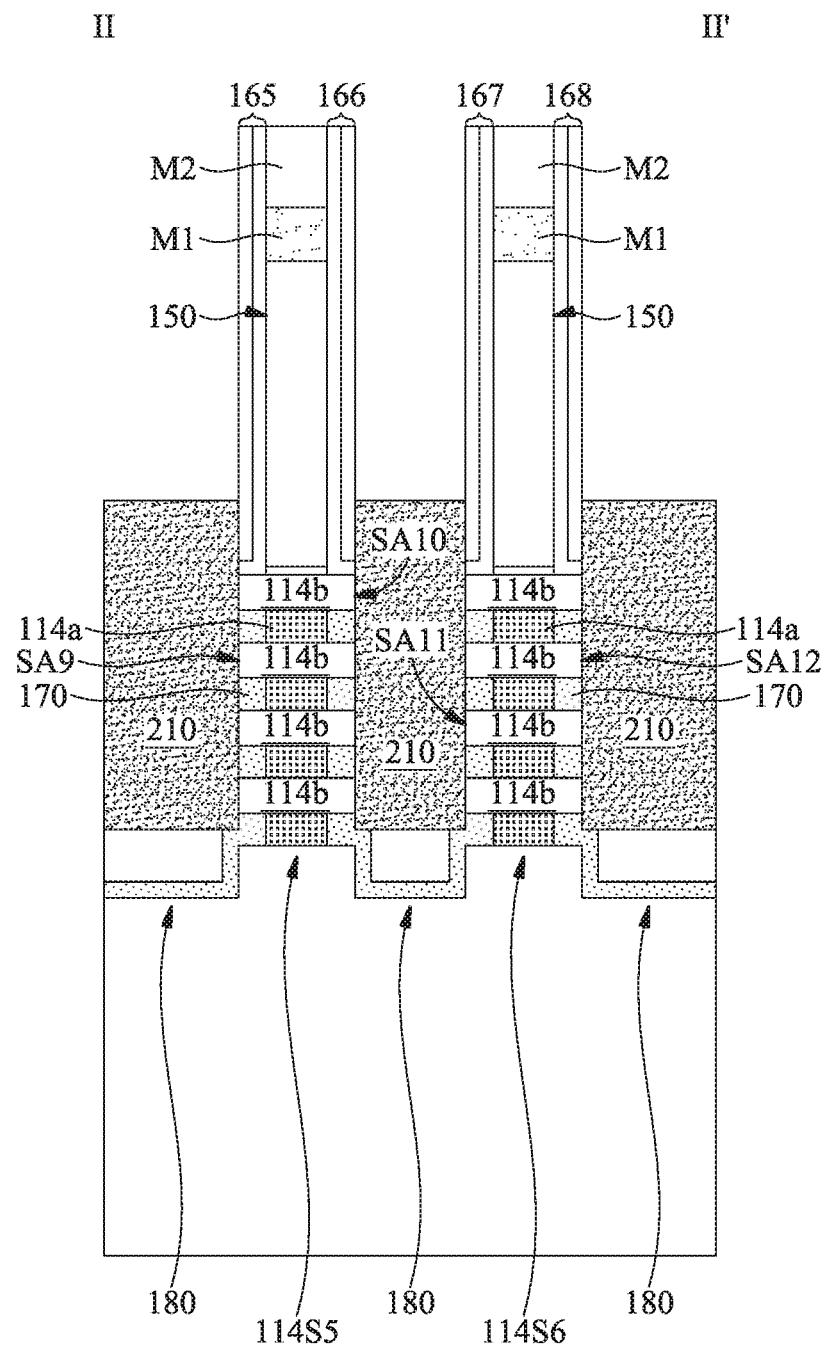
Figure 1H:
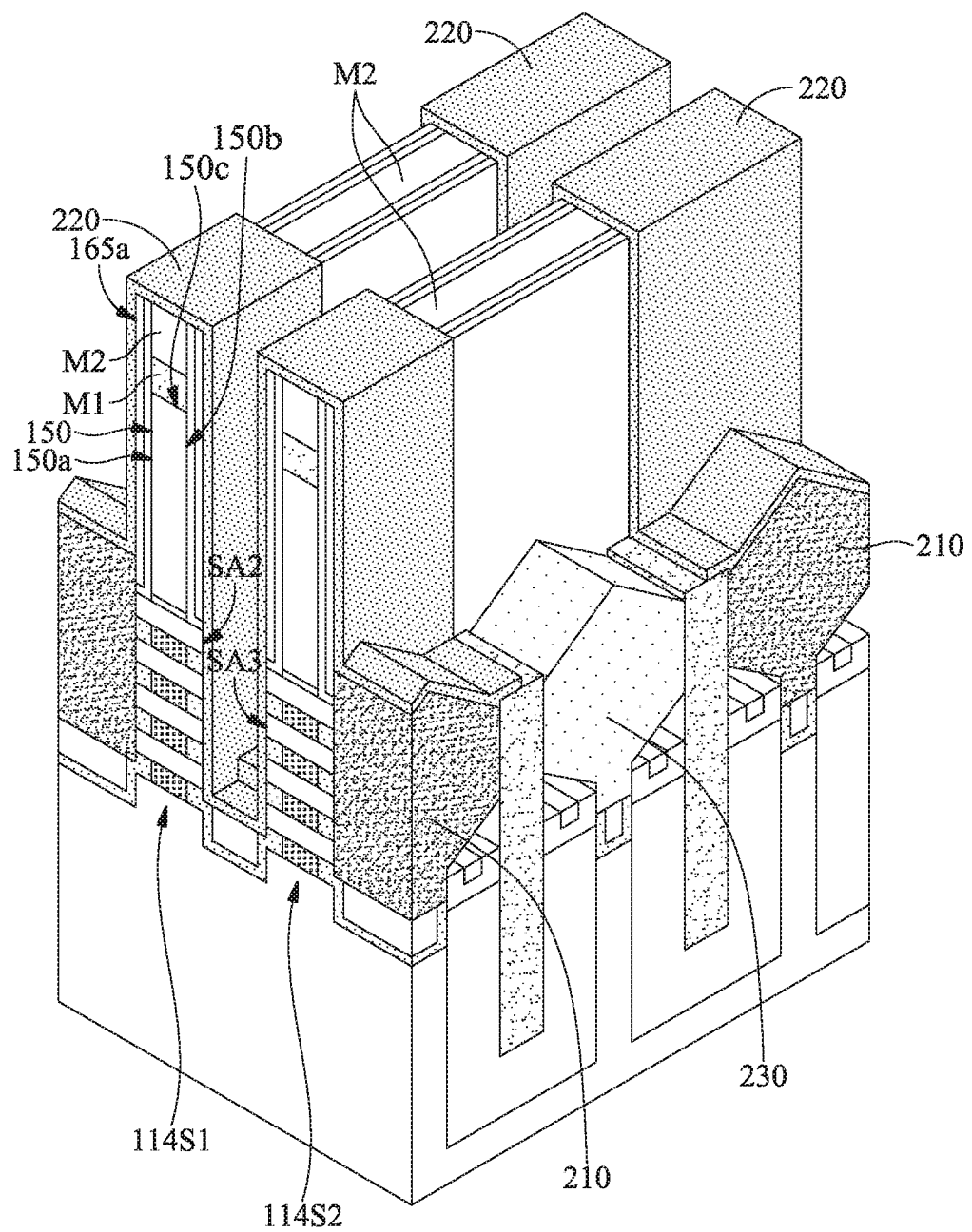
Figures 1, 1H:
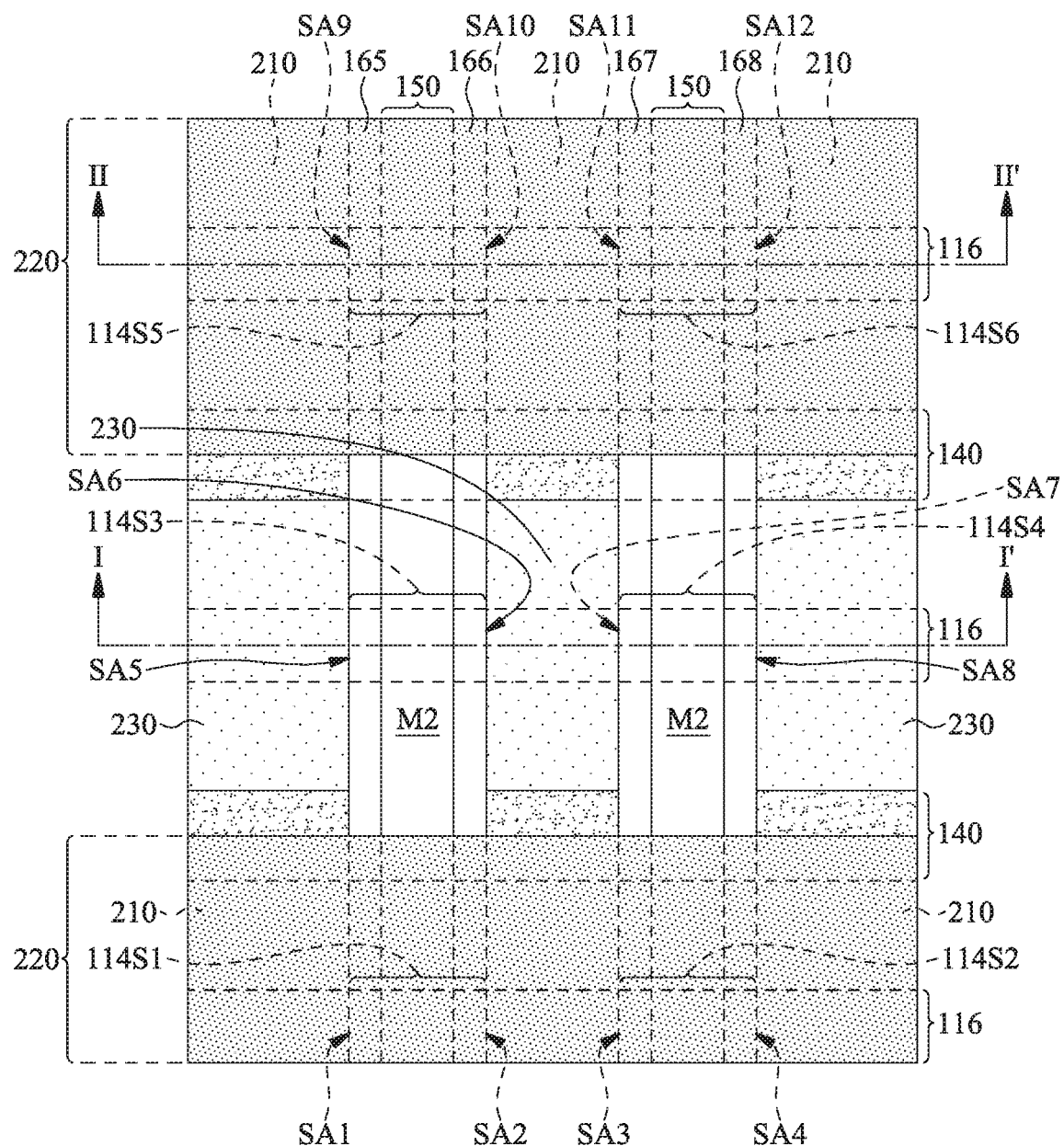
Figures 1, 1H, 2:
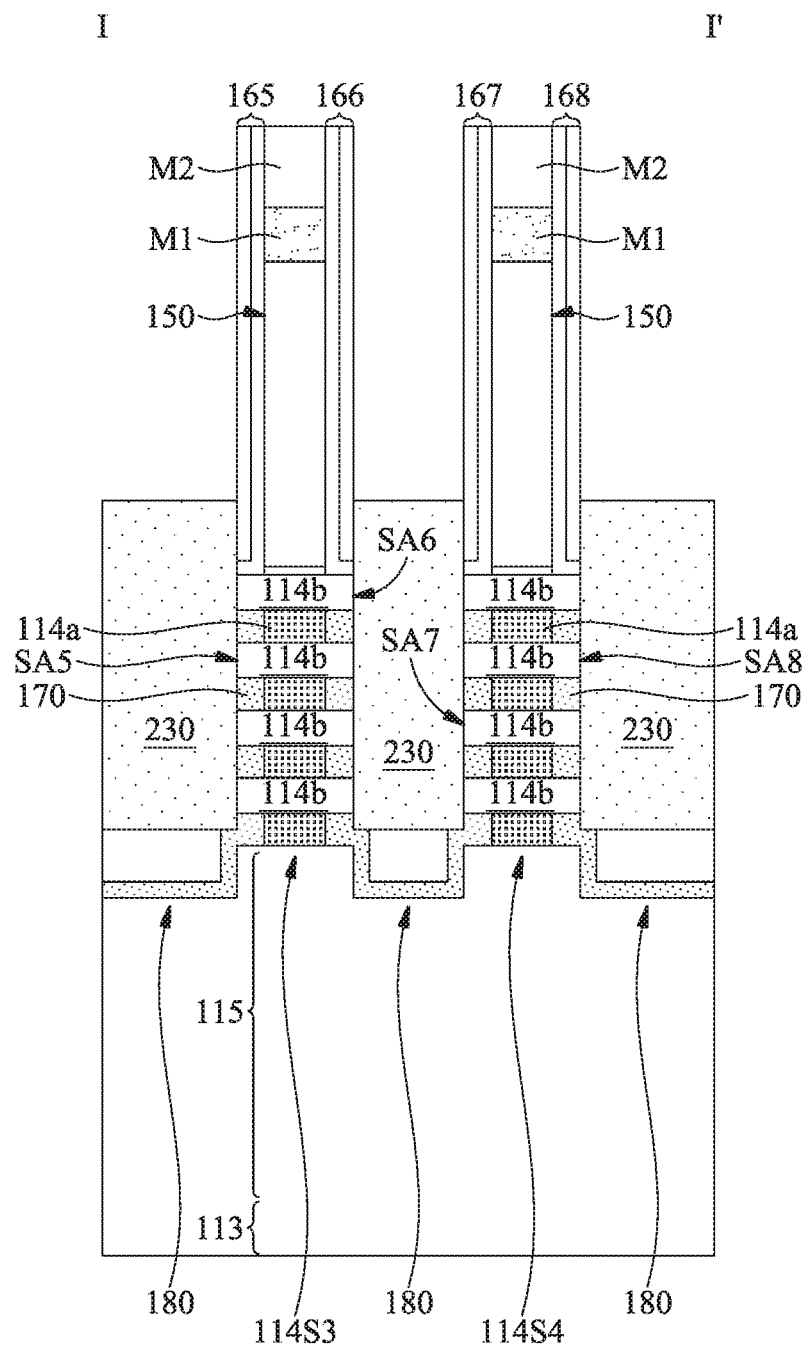
Figures 1, 1H, 2, 3:
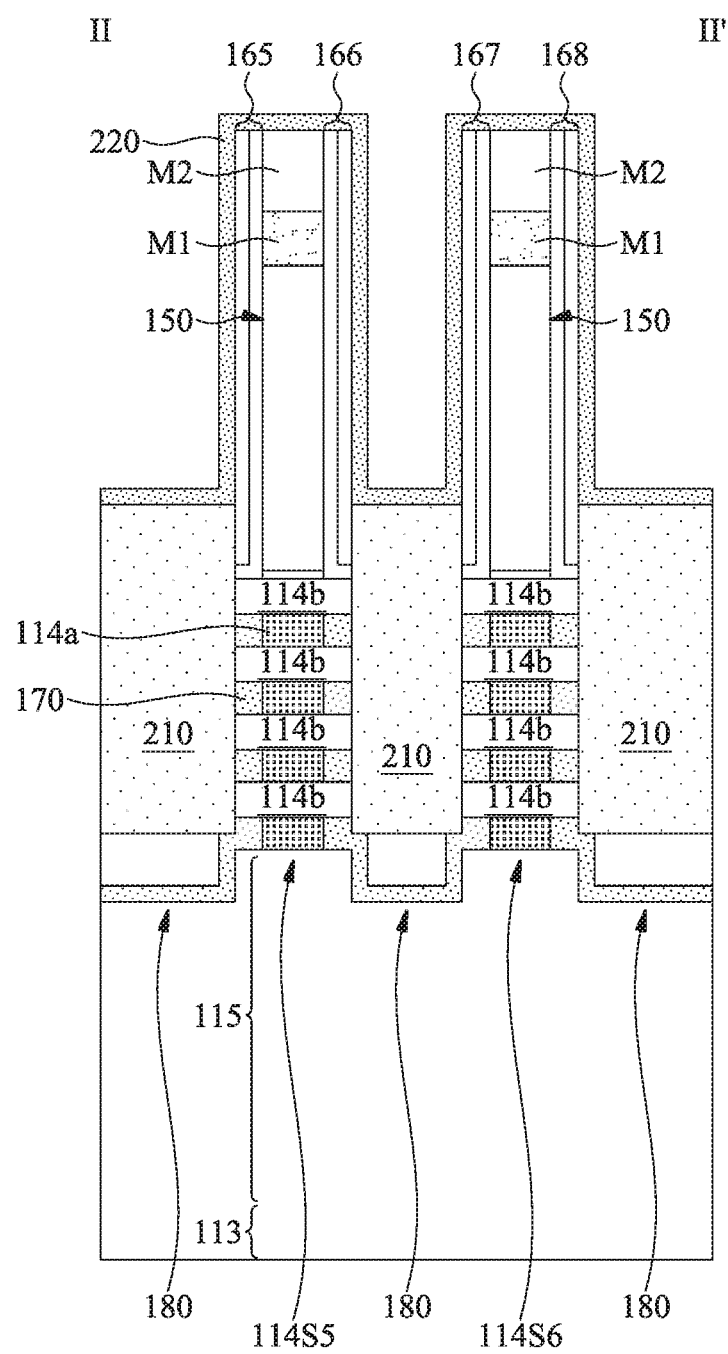

FIG. 1H-1 is a top view of the semiconductor device structure of FIG. 1H, in accordance with some embodiments. FIG. 1H-2 is a cross-sectional view illustrating the semiconductor device structure along a sectional line I-I' in FIG. 1H-1, in accordance with some embodiments. FIG. 1H-3 is a cross-sectional view illustrating the semiconductor device structure along a sectional line II-II' in FIG. 1H-1, in accordance with some embodiments.

As shown in FIGS. 1H and 1H-1, the mask layer 190 is removed, in accordance with some embodiments. As shown in FIGS. 1H, 1H-1 and 1H-3, a mask layer 220 is formed over the stressors 210, the sidewall SA2 of the multilayer stack 114S1, and the sidewall SA3 of the multilayer stack 114S2, in accordance with some embodiments. The mask layer 220 covers opposite sidewalls 150a and 150b and a top surface 150c of each gate stack 150, in accordance with some embodiments.

As shown in FIGS. 1H, 1H-1 and 1H-2, stressors 230 are formed over the sidewalls SA5, SA6, SA7, and SA8, in accordance with some embodiments. In some embodiments, the stressors 230 are made of a semiconductor material (e.g., silicon) with N-type dopants, such as the Group VA element, in accordance with some embodiments. The Group VA element includes phosphor (P), antimony (Sb), or another suitable Group VA material.

In some other embodiments, the stressors 230 are made of a semiconductor material (e.g., silicon germanium) with P-type dopants, such as the Group IIIA element, in accordance with some embodiments. The Group IIIA element includes boron or another suitable material.

The stressors 210 and 230 are made of different materials, in accordance with some embodiments. For example, the stressors 210 are made of silicon germanium with P-type dopants, and the stressors 230 are made of silicon with N-type dopants. In some embodiments, the stressors 210 are made of silicon with N-type dopants, and the stressors 230 are made of silicon germanium with P-type dopants. The stressors 230 are formed using an epitaxial process, in accordance with some embodiments.

Figure 1I:
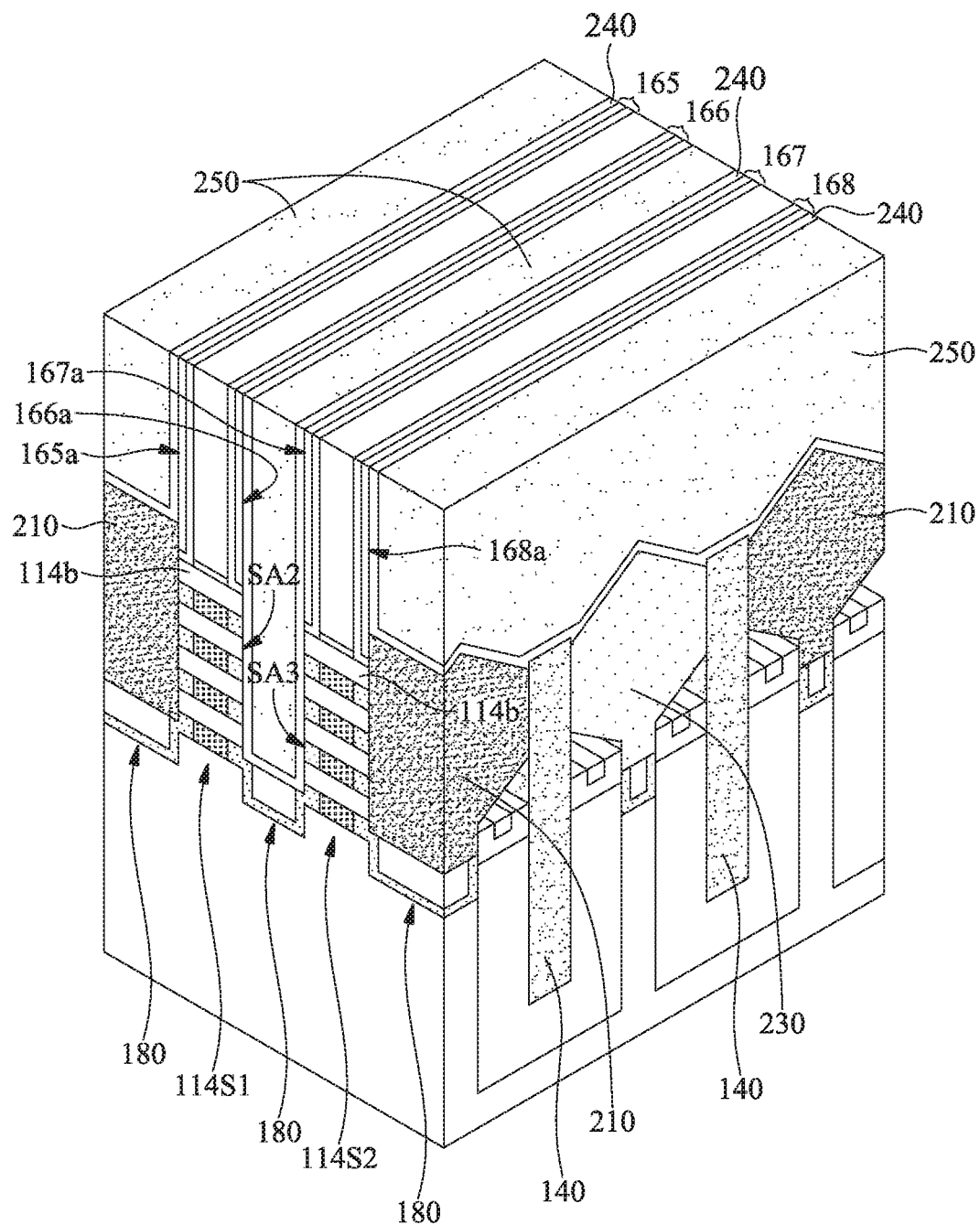

As shown in FIG. 1I, the mask layer 220 is removed, in accordance with some embodiments. As shown in FIG. 1I, an etch stop layer 240 is formed over the stressors 210 and 230, the dielectric fins 140, the sidewall SA2 of the multilayer stack 114S1, the sidewall SA3 of the multilayer stack 114S2, and the sidewalls 165a, 166a, 167a, and 168a of the spacers 165, 166, 167, and 168, in accordance with some embodiments.

The etch stop layer 240 continuously covers the sidewall SA2 of the multilayer stack 114S1, the bottom spacer 180 between the sidewalls SA2 and SA3, and the sidewall SA3 of the multilayer stack 114S2, in accordance with some embodiments. The etch stop layer 240 is made of a nitride-containing material, such as silicon nitride (SiN), silicon oxynitride (SiON), or silicon carbonitride (SiCN), in accordance with some embodiments.

Thereafter, as shown in FIG. 1I, a dielectric layer 250 is formed over the etch stop layer 240, in accordance with some embodiments. The etch stop layer 240 is between the dielectric layer 250 and the multilayer stacks 114S1 and 114S2 to separate the dielectric layer 250 from the multilayer stacks 114S1 and 114S2, in accordance with some embodiments. The channel layers 114b of the multilayer stack 114S1 are electrically insulated from the channel layers 114b of the multilayer stack 114S2 by the dielectric layer 250, in accordance with some embodiments.

The dielectric layer 250 is made of an oxide-containing insulating material, such as silicon oxide, or a nitride-containing insulating material, such as silicon nitride, silicon oxynitride, silicon oxycarbonitride, or silicon carbonitride, in accordance with some embodiments.

Figure 1J:
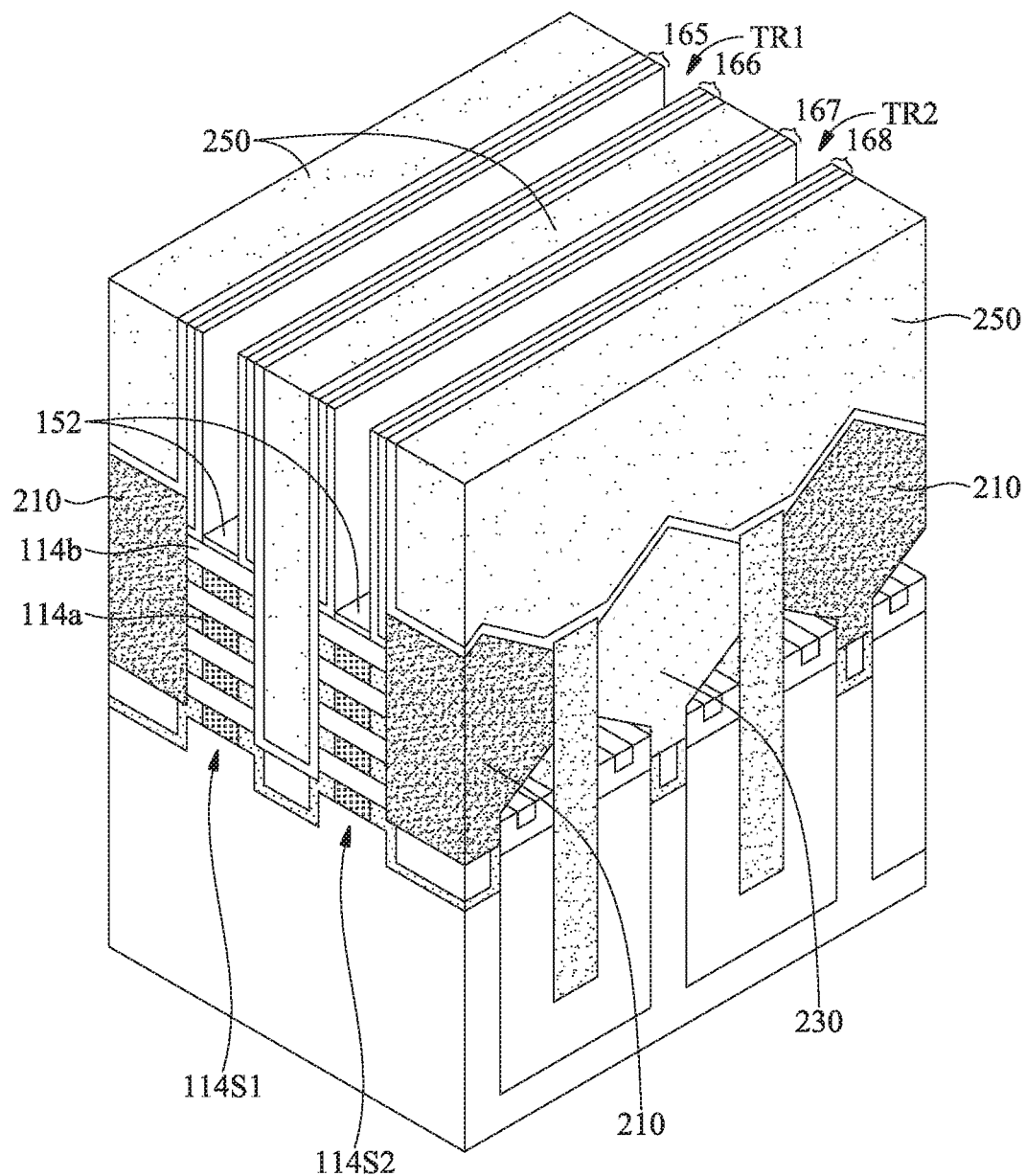
Figures 1, 1J:
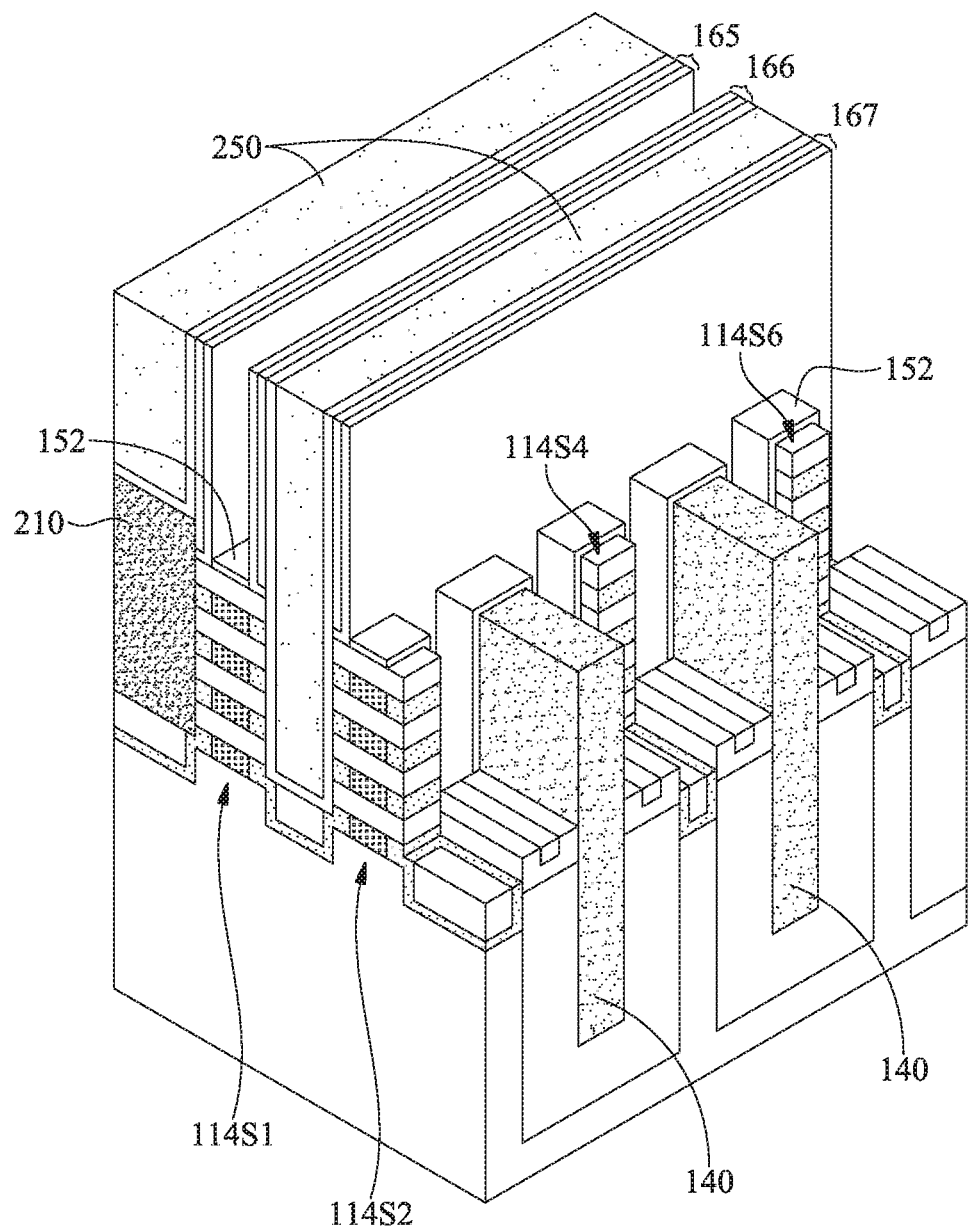

FIG. 1J-1 is a perspective view of a portion of the semiconductor device structure of FIG. 1J, in accordance with some embodiments. For the sake of clear illustration, FIG. 1J-1 omits portions of the dielectric layer 250, the etch stop layer 240, the stressors 210 and 230, and the spacer 168, in accordance with some embodiments.

As shown in FIGS. 1J and 1J-1, the gate electrodes 154 are removed to form trenches TR1 and TR2, in accordance with some embodiments. The trench TR1 is between the spacers 165 and 166, in accordance with some embodiments. The trench TR2 is between the spacers 167 and 168, in accordance with some embodiments. The removal process includes an etching process, such as a wet etching process or a dry etching process, in accordance with some embodiments.

Figure 1K:
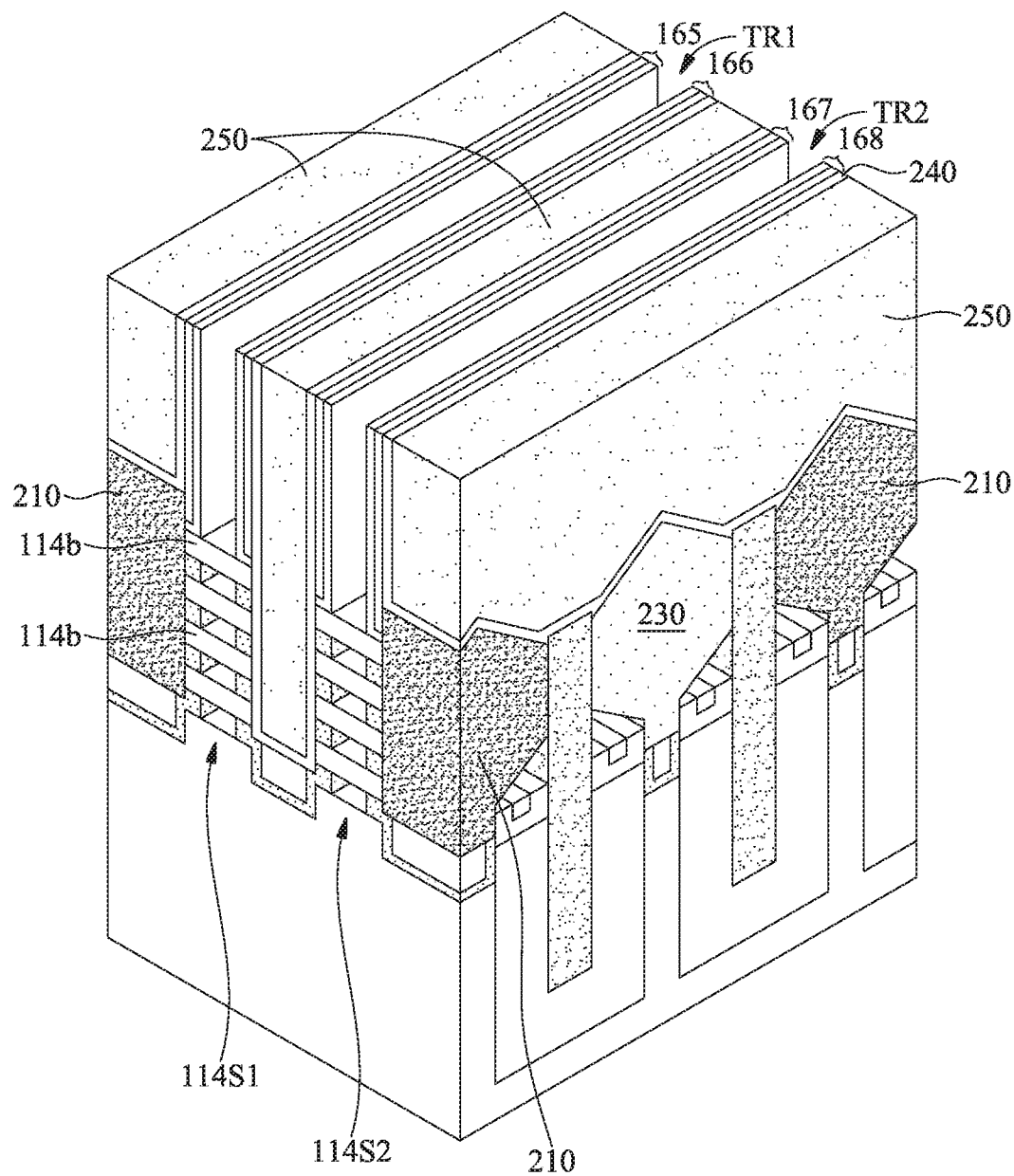
Figures 1, 1K:
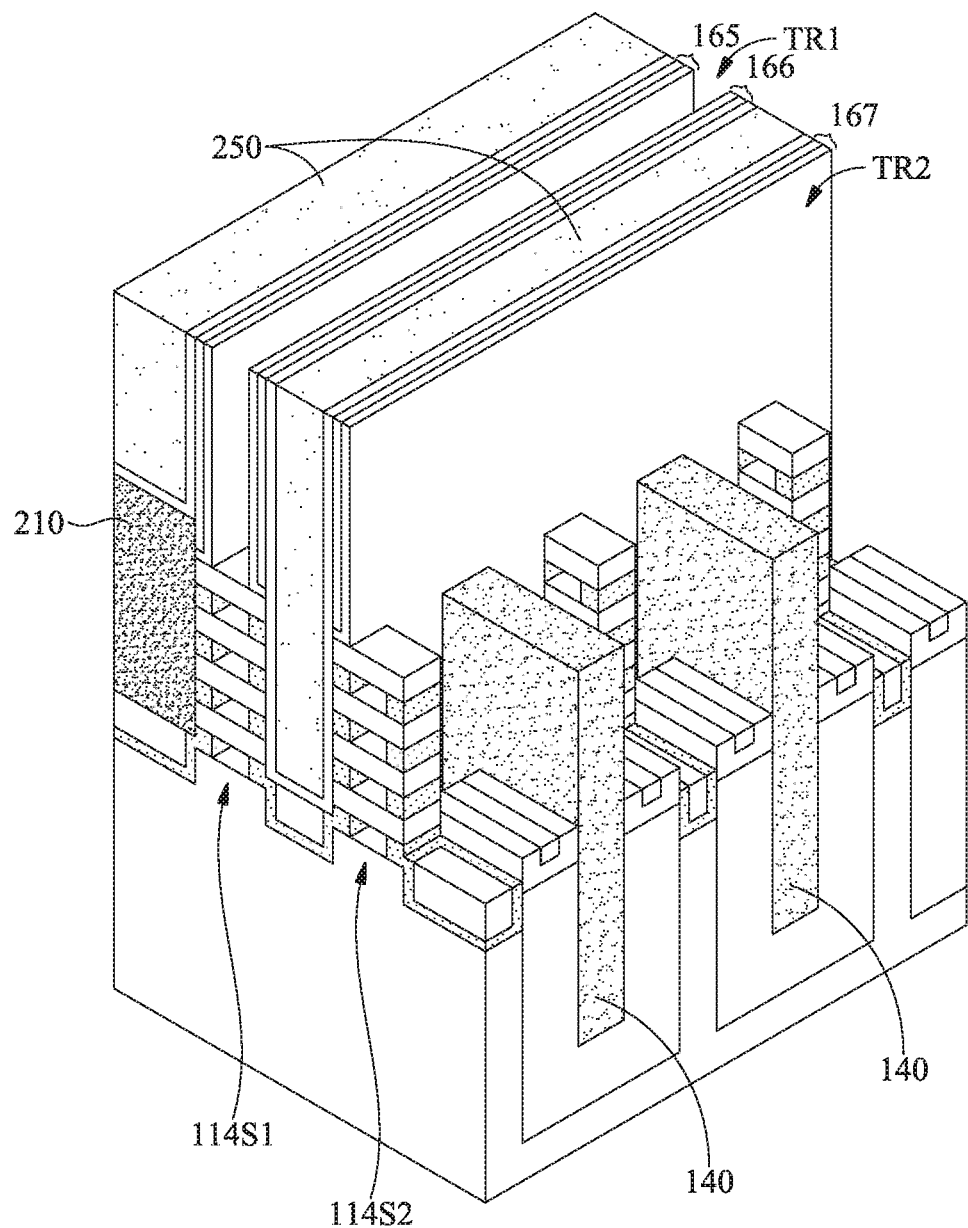

FIG. 1K-1 is a perspective view of a portion of the semiconductor device structure of FIG. 1K, in accordance with some embodiments. For the sake of clear illustration, FIG. 1K-1 omits portions of the dielectric layer 250, the etch stop layer 240, the stressors 210 and 230, and the spacer 168, in accordance with some embodiments.

As shown in FIGS. 1J, 1K and 1K-1, the gate dielectric layers 152 are removed through the trenches TR1 and TR2, in accordance with some embodiments. The removal process includes an etching process, such as a wet etching process or a dry etching process, in accordance with some embodiments.

Thereafter, as shown in FIGS. 1K and 1K-1, the sacrificial layers 114a are removed through the trenches TR1 and TR2, in accordance with some embodiments. The removal process includes an etching process, such as a wet etching process or a dry etching process, in accordance with some embodiments.

Figure 1L:
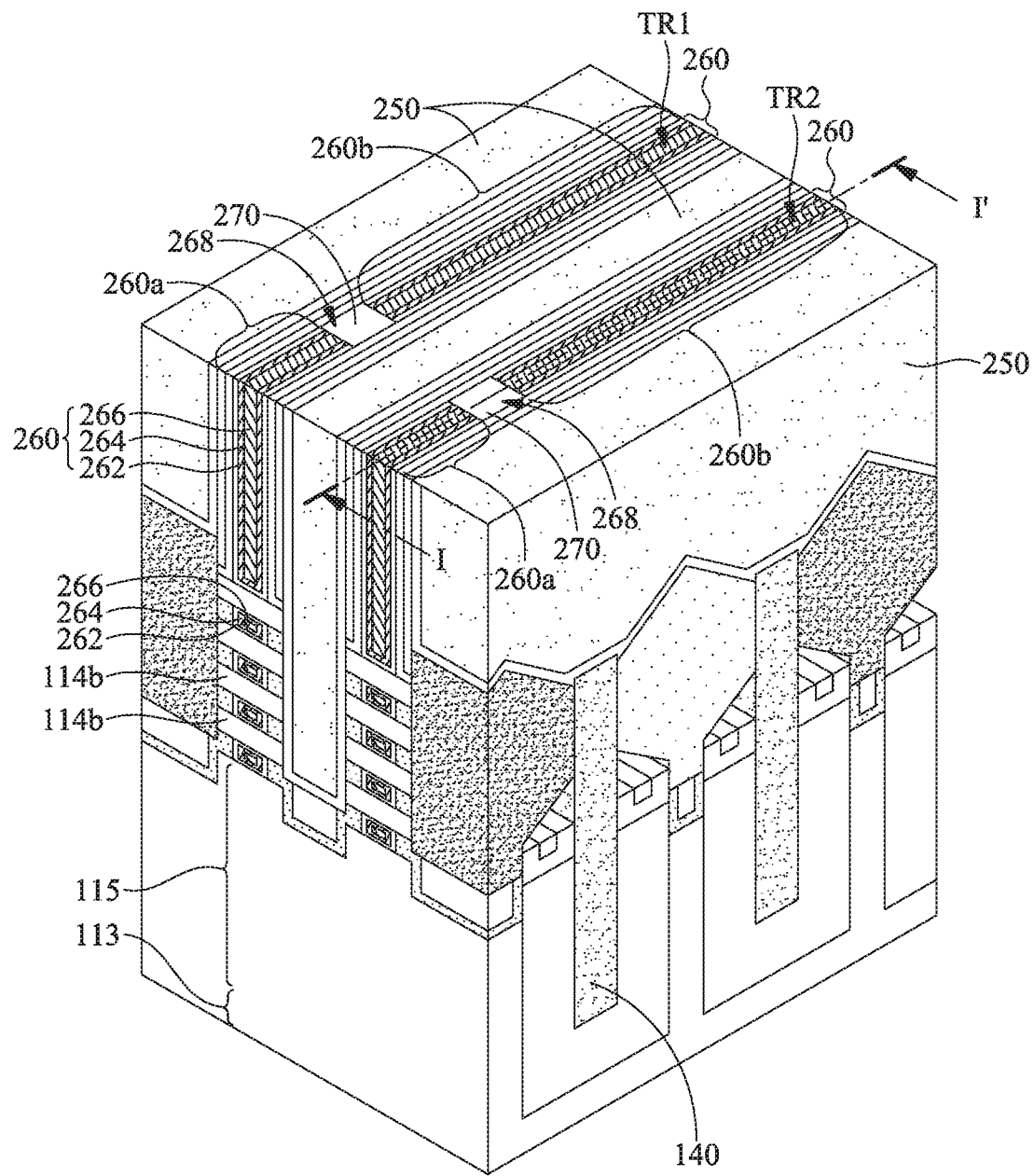
Figures 1, 1L:
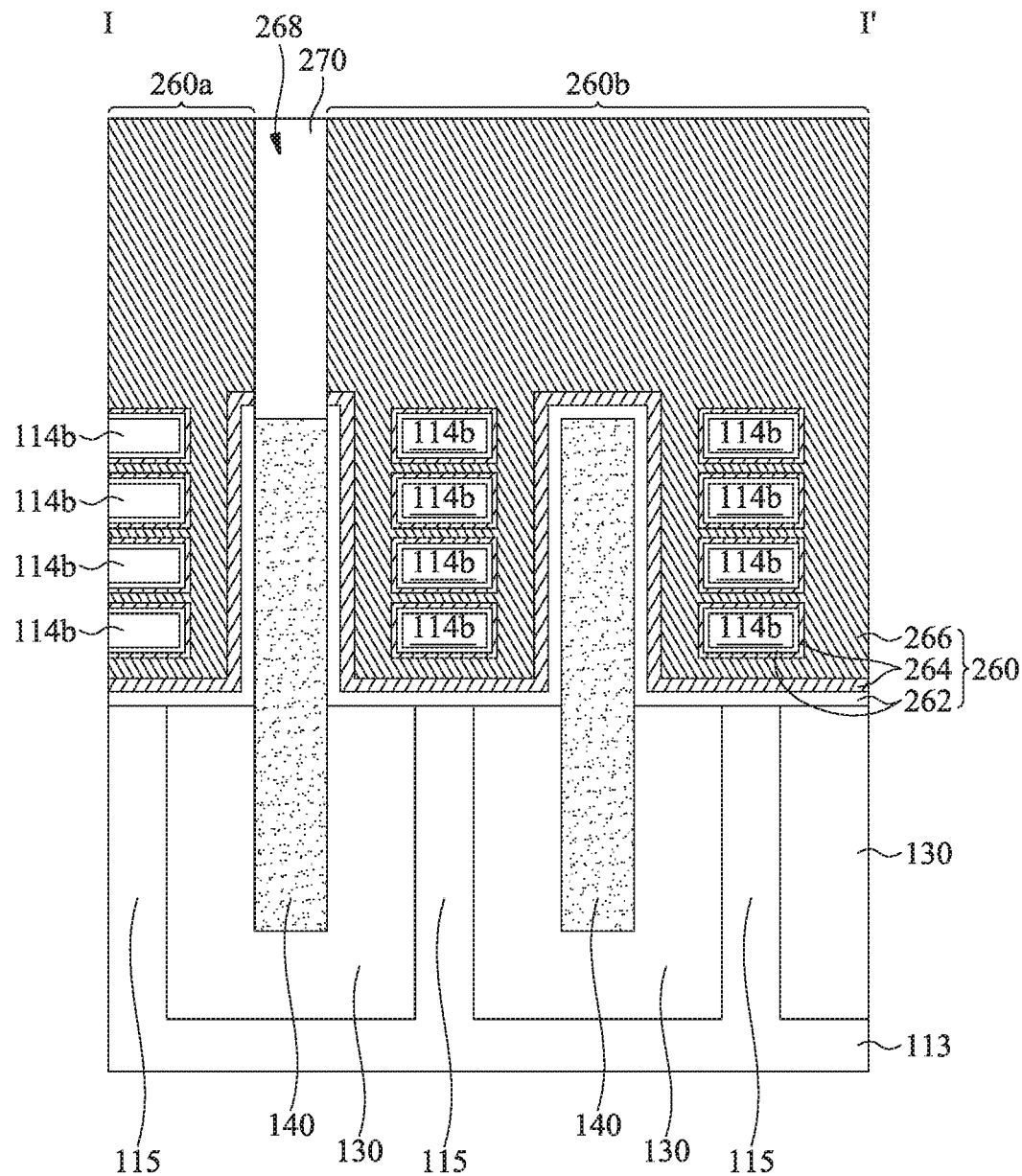

FIG. 1L-1 is a cross-sectional view illustrating the semiconductor device structure along a sectional line I-I' in FIG. 1L, in accordance with some embodiments. As shown in FIGS. 1L and 1L-1, gate stacks 260 are formed in the trenches TR1 and TR2, in accordance with some embodiments. Each gate stack 260 includes a gate dielectric layer 262, a work function layer 264, and a gate electrode layer 266, in accordance with some embodiments.

The gate dielectric layer 262, the work function layer 264, and the gate electrode layer 266 are sequentially stacked over the channel layers 114b, in accordance with some embodiments. The gate stack 260 wraps around the channel layers 114b, in accordance with some embodiments. In some embodiments, a portion of the gate stack 260 is between the channel layer 114b and the bottom portion 115 (or the base 113).

Thereafter, as shown in FIGS. 1L and 1L-1, a through hole 268 is formed in each gate stack 260 to divide each gate stack 260 into gate stacks 260a and 260b, in accordance with some embodiments. The through hole 268 is formed using an etching process, such as a dry etching process, in accordance with some embodiments.

Afterwards, as shown in FIGS. 1L and 1L-1, dielectric structures 270 are formed in the through holes 268, in accordance with some embodiments. The dielectric structures 270 are made of an oxide-containing insulating material (e.g., silicon oxide), a nitride-containing insulating material (e.g., silicon nitride, silicon oxynitride, silicon oxycarbonitride, or silicon carbonitride), or silicon carbide, in accordance with some embodiments.

Figure 1M:
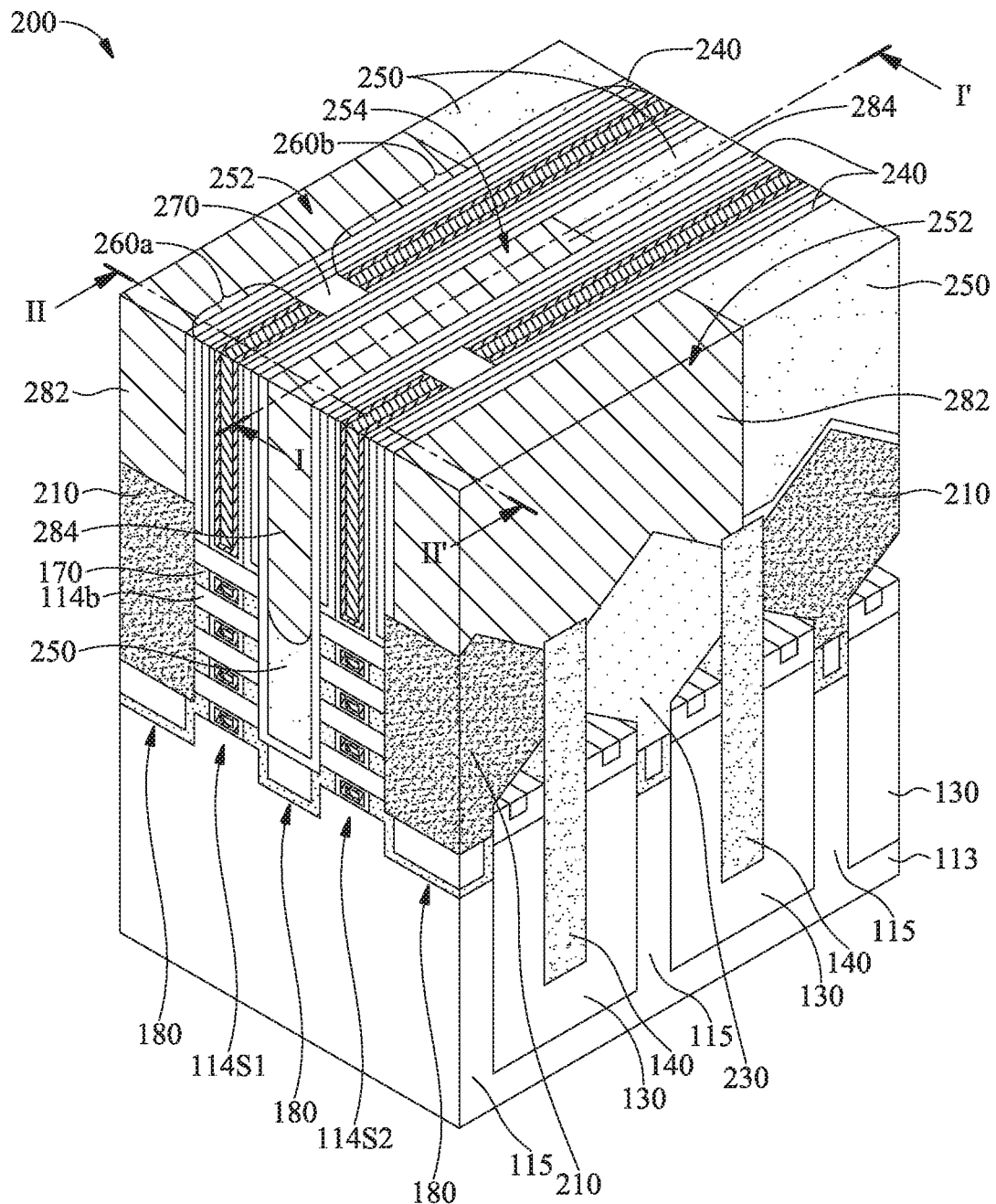
Figures 1, 1M:
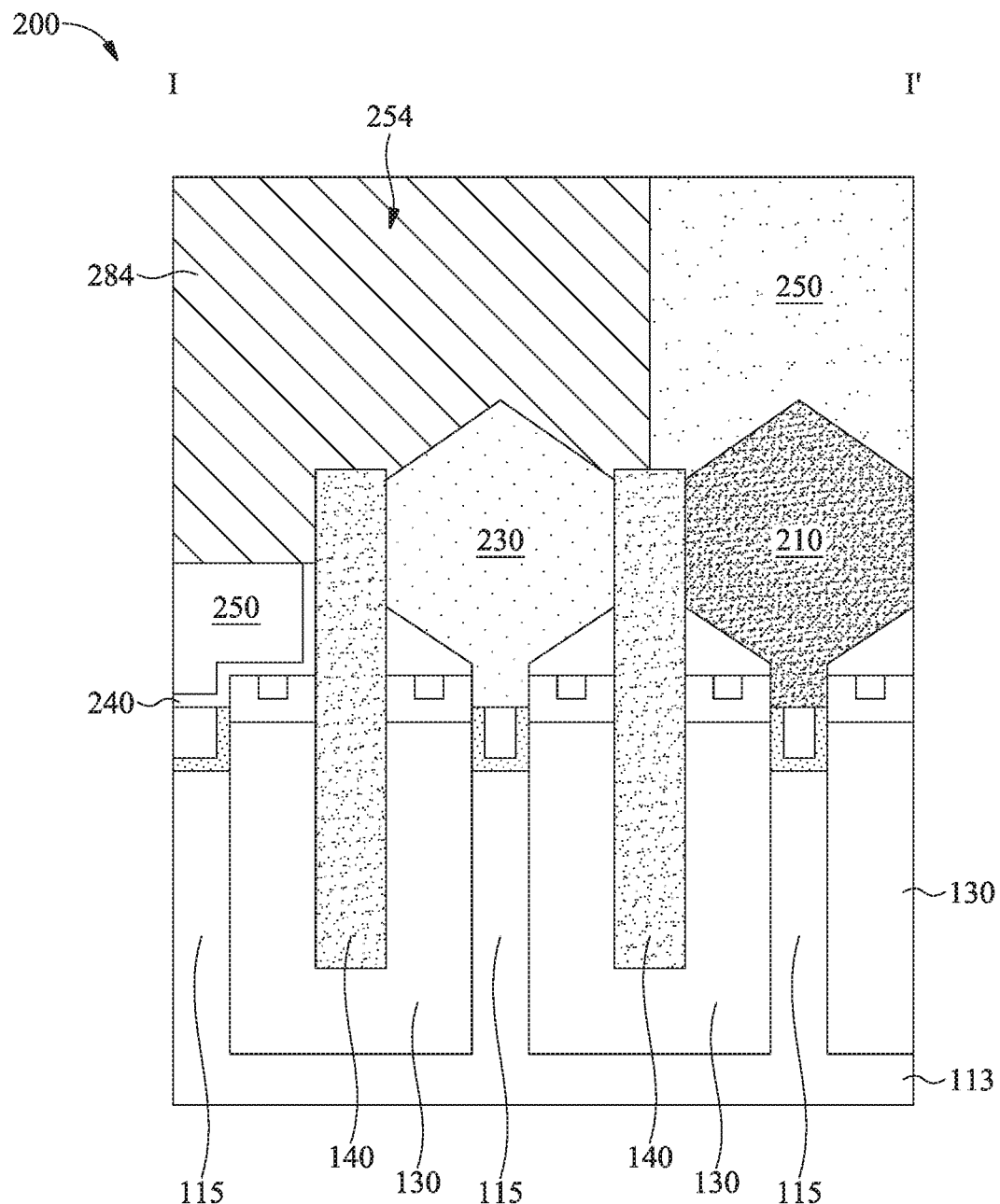
Figures 1, 1M, 2:
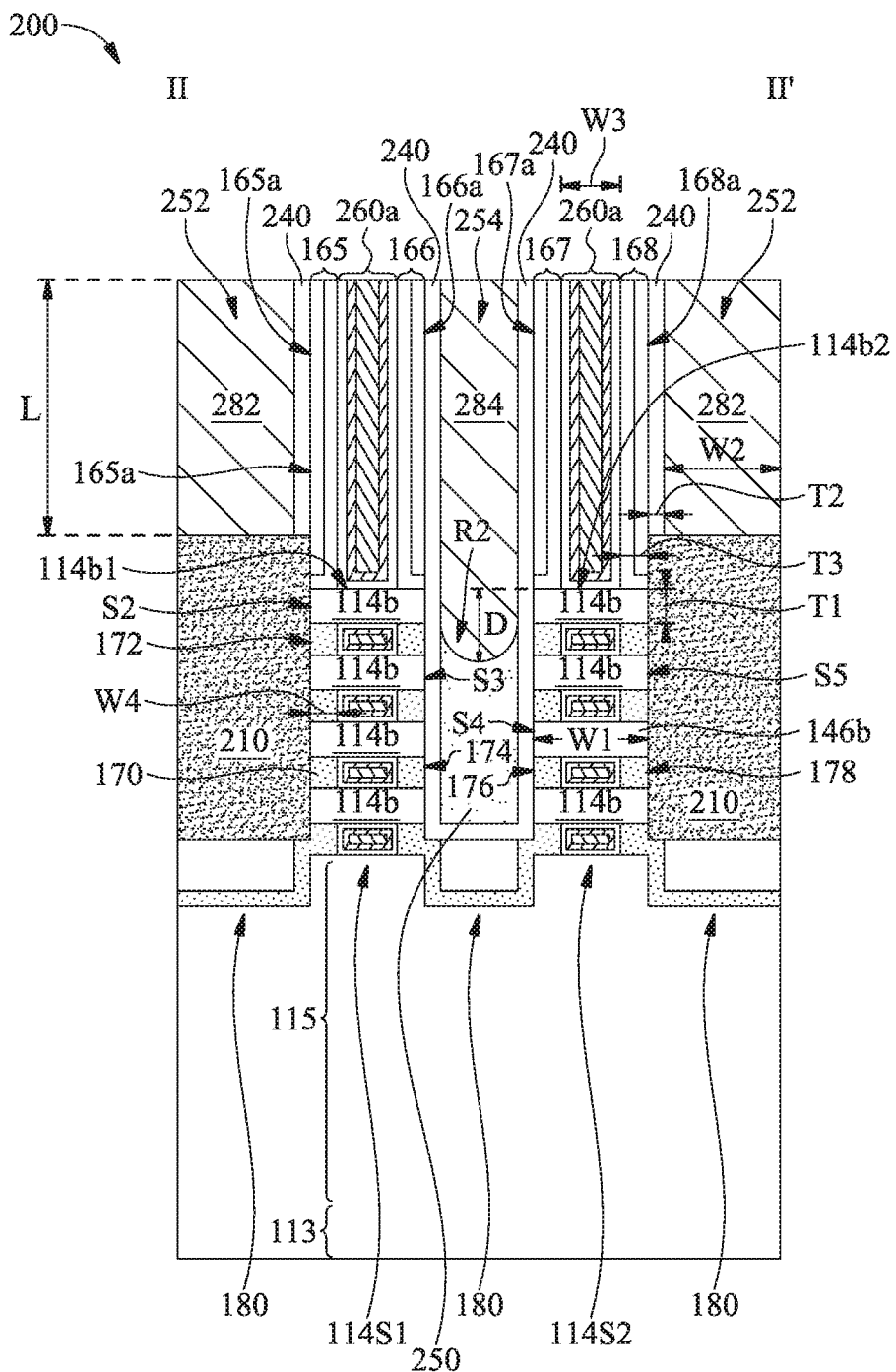
Figure 2:
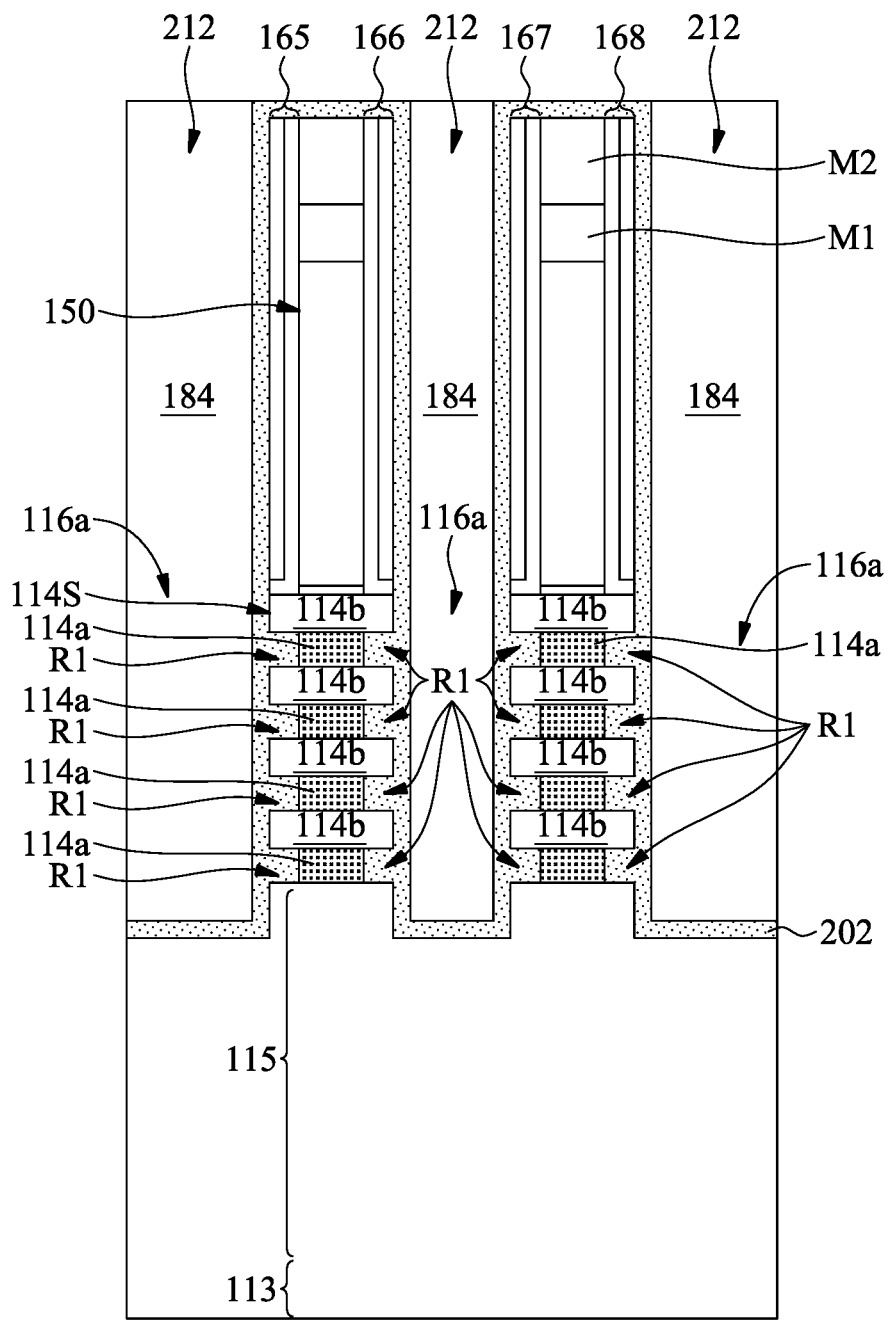
Figure 3:
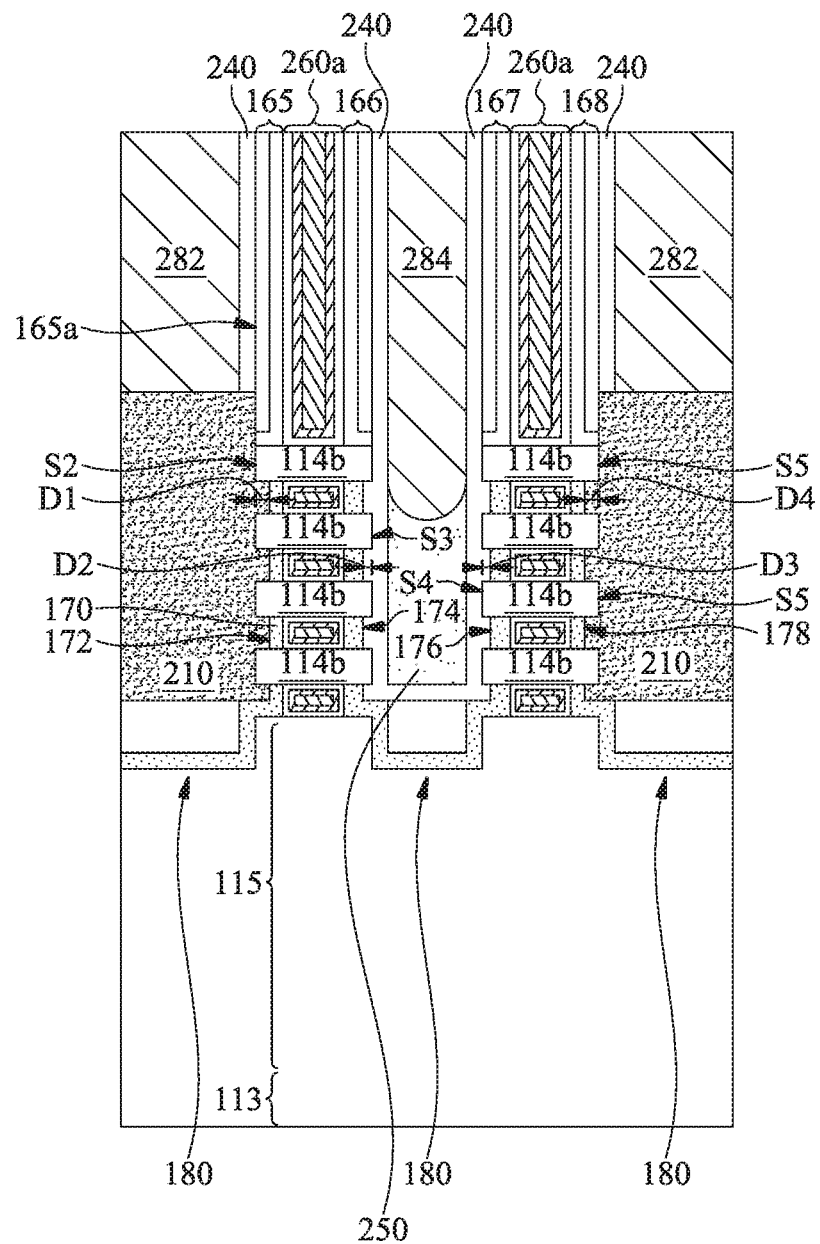

FIG. 1M-1 is a cross-sectional view illustrating the semiconductor device structure along a sectional line I-I' in FIG. 1M, in accordance with some embodiments. FIG. 1M-2 is a cross-sectional view illustrating the semiconductor device structure along a sectional line II-II' in FIG. 1M, in accordance with some embodiments.

As shown in FIGS. 1M, 1M-1, and 1M-2, portions of the dielectric layer 250 are removed to form trenches 252 and 254 in the dielectric layer 250, in accordance with some embodiments. Each trench 252 exposes the stressors 210 and 230, in accordance with some embodiments. As shown in FIG. 1M-1, the trench 254 exposes the stressor 230 and the dielectric layer 250 between the multilayer stacks 114S1 and 114S2, in accordance with some embodiments.

As shown in FIGS. 1M, 1M-1, and 1M-2, contact structures 282 and 284 are respectively formed in the trenches 252 and 254, in accordance with some embodiments. In this step, a semiconductor device structure 200 is substantially formed, in accordance with some embodiments. The semiconductor device structure 200 is used in, for example, a static random access memory (SRAM) device. The contact structure 282 is in direct contact with and is electrically connected to the stressors 210 and 230 thereunder, in accor- The contact structure 284 is between the gate stacks 260a, between the dielectric structures 270, between the gate stacks 260b, between the multilayer stacks 114S1 and 114S2, and between the multilayer stacks 114S3 and 114S4 (as shown in FIG. 1H-1), in accordance with some embodiments. As shown in FIG. 1M, the contact structure 284 is in direct contact with and is electrically connected to the stressor 230 thereunder, in accordance with some embodiments. The contact structure 284 is in direct contact with the dielectric fins 140, the etch stop layer 240, and the dielectric layer 250 thereunder, in accordance with some embodiments.

In some embodiments, a bottom surface 284a of the contact structure 284 is lower than a bottom surface 282a of the contact structures 282. The contact structure 284 is between the channel layers 114b of the multilayer stack 114S1 or 114S2, in accordance with some embodiments.

The contact structures 282 and 284 are made of tungsten (W), cobalt (Co), aluminum (Al), ruthenium (Ru), copper (Cu) or another suitable conductive material, in accordance with some embodiments. The formation of the contact structures 282 and 284 includes depositing a conductive material layer (not shown) over the dielectric layer 250 and in the trenches 252 and 254; and performing a chemical mechanical polishing (CMP) process over the conductive material layer to remove the conductive material layer outside of the trenches 252 and 254.

The embodiments prevent the stressors 210 and 230 from being formed over the sidewalls S3 and S4 by using the mask layers 190 and 220, in accordance with some embodiments. The dielectric layer 250 formed over the stressors 210 and 230 is also filled into the trench between the sidewalls S3 and S4, and therefore the dielectric layer 250 is able to be self-aligned with the multilayer stacks 114S1 and 114S2 and the gate stacks 260a thereover, in accordance with some embodiments. Therefore, there is no need to perform any additional process to form a trench and a dielectric layer in the trench in the fin structures 116 before the formation of the gate stacks 150 of FIG. 1C, in accordance with some embodiments. As a result, there is no need to maintain alignment accuracy between the dielectric layer 250 and the gate stacks 260a (or the multilayer stacks 114S1 and 114S2). Therefore, the manufacturing process is simplified, production cost is reduced, the manufacturing time is shortened, productivity is increased, and the yield of the semiconductor device structure 200 is improved.

As shown in FIG. 1M-2, a thickness T1 of the channel layer 114b ranges from about 2 nm to about 10 nm, in accordance with some embodiments. In some embodiments, a width W1 of the channel layer 114b ranges from about 5 nm to about 70 nm, in accordance with some embodiments. In some embodiments, a thickness T2 of the etch stop layer 240 ranges from about 2 nm to about 10 nm. In some embodiments, a thickness T3 of the spacer 165, 166, 167, or 168 ranges from about 2 nm to about 10 nm.

In some embodiments, a width W2 of the contact structure 282 ranges from about 5 nm to about 30 nm, in accordance with some embodiments. In some embodiments, a length L of the contact structure 282 ranges from about 3 nm to about 40 nm, in accordance with some embodiments.

In some embodiments, a width W3 of the gate stack 260a ranges from about 4 nm to about 25 nm, in accordance with some embodiments. In some embodiments, a width W4 of the inner spacer 170 ranges from about 2 nm to about 20 nm. In some embodiments, the dielectric layer 250 between the multilayer stacks 114S1 and 114S2 has a recess R2 with a depth D with respect to a top surface 114b1 or 114b2 of the multilayer stack 114S1 or 114S2. The depth D ranges from about 1 nm to about 20 nm, in accordance with some embodiments. In some other embodiments, the depth D is about 0 nm, and the recess R2 is almost invisible.

Figure 4:
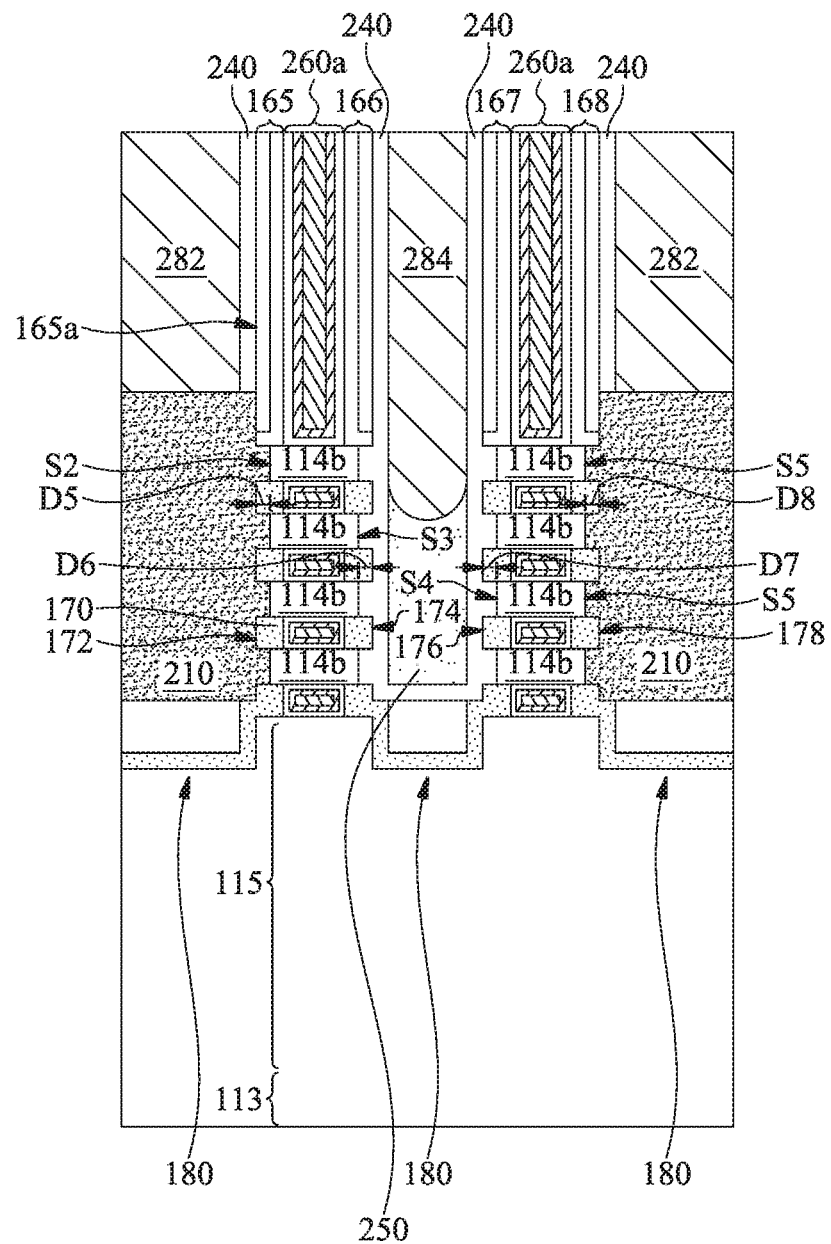
FIG. 4 is a cross-sectional view of a semiconductor device structure, in accordance with some embodiments.

As shown in FIG. 1M-2, the sidewalls S2, S3, S4, and S5 of the channel layers 114b are respectively and substantially coplanar with sidewalls 165a, 166a, 167a, and 168a of the spacers 165, 166, 167, and 168, in accordance with some embodiments. As shown in FIG. 1M-2, the sidewalls S2, S3, S4, and S5 of the channel layers 114b are respectively and substantially coplanar with the sidewalls 172, 174, 176, and 178 of the inner spacers 170, in accordance with some embodiments. In some other embodiments, as shown in FIGS. 3 and 4, the sidewalls S2, S3, S4, and S5 of the channel layers 114b are misaligned with the sidewalls 172, 174, 176, and 178 of the inner spacers 170, in accordance with some embodiments.

As shown in FIG. 3, the sidewall 172 is recessed from the sidewalls S2, in accordance with some embodiments. The sidewall 174 is recessed from the sidewalls S3, in accordance with some embodiments. The sidewall 176 is recessed from the sidewalls S4, in accordance with some embodiments. The sidewall 178 is recessed from the sidewalls S5, in accordance with some embodiments. The channel layers 114b laterally extend out of the sidewalls 172, 174, 176, and 178 of the inner spacers 170, which improves the formation of the stressors 210 over the channel layers 114b, in accordance with some embodiments.

As shown in FIG. 3, a distance D1 is between the sidewalls 172 and S2, in accordance with some embodiments. A distance D2 is between the sidewalls 174 and S3, in accordance with some embodiments. A distance D3 is between the sidewalls 176 and S4, in accordance with some embodiments. A distance D4 is between the sidewalls 178 and S5, in accordance with some embodiments.

In some embodiments, the distance D1 is different from the distance D2. In some other embodiments, the distance D1 is substantially equal to the distance D2. The term "substantially equal to" in the application means "within 10%", in accordance with some embodiments. For example, the term "substantially equal to" means the difference between the distances D1 and D2 is within 10% of the average of the distances D1 and D2, in accordance with some embodiments. The difference may be due to manufacturing processes.

In some embodiments, the distance D3 is different from the distance D4. In some other embodiments, the distance D3 is substantially equal to the distance D4. The term "substantially equal to" in the application means "within 10%", in accordance with some embodiments. For example, the term "substantially equal to" means the difference between the distances D3 and D4 is within 10% of the average of the distances D3 and D4, in accordance with some embodiments. The difference may be due to manufacturing processes. The distance D1, D2, D3, or D4 ranges from about 1 nm to about 3 nm, in accordance with some embodiments.

As shown in FIG. 4, the sidewall S2 is recessed from the sidewalls 172, in accordance with some embodiments. The sidewall S3 is recessed from the sidewalls 174, in accordance with some embodiments. The sidewall S4 is recessed from the sidewalls 176, in accordance with some embodiments. The sidewall S5 is recessed from the sidewalls 178, in accordance with some embodiments. The channel layers 114b are shortened with respect to the channel layers 114b of FIG. 1M-2, and therefore the channel length is shorten, in accordance with some embodiments.

The forming method of the channel layers 114*b* of FIG. 4 is similar to that of the channel layers 114*b* of FIG. 1M-2, except that the formation of the channel layers 114*b* of FIG. 4 further includes performing an etching back process over sidewalls of the channel layers 114*b* after the formation of the inner spacers 170 of FIG. 1F and before the formation of the stressors 210, in accordance with some embodiments.

As shown in FIG. 4, a distance D5 is between the sidewalls 172 and S2, in accordance with some embodiments. A distance D6 is between the sidewalls 174 and S3, in accordance with some embodiments. A distance D7 is between the sidewalls 176 and S4, in accordance with some embodiments. A distance D8 is between the sidewalls 178 and S5, in accordance with some embodiments.

In some embodiments, the distance D5 is different from the distance D6. In some other embodiments, the distance D5 is substantially equal to the distance D6. The term "substantially equal to" in the application means "within 10%", in accordance with some embodiments. For example, the term "substantially equal to" means the difference between the distances D5 and D6 is within 10% of the average of the distances D5 and D6, in accordance with some embodiments. The difference may be due to manufacturing processes.

In some embodiments, the distance D7 is different from the distance D8. In some other embodiments, the distance D7 is substantially equal to the distance D8. The term "substantially equal to" in the application means "within 10%", in accordance with some embodiments. For example, the term "substantially equal to" means the difference between the distances D7 and D8 is within 10% of the average of the distances D7 and D8, in accordance with some embodiments. The difference may be due to manufacturing processes. The distance D5, D6, D7, or D8 ranges from about 1 nm to about 3 nm, in accordance with some embodiments.

Although FIG. 1M-2 shows that one side of the multilayer stack (e.g., the multilayer stack 114S1) is connected to the stressor 210, and the other side of the multilayer stack is covered by the dielectric layer 250 to be electrically insulated from the adjacent multilayer stack (e.g., the multilayer stack 114S2), the embodiments are not limited thereto. For example, as shown in FIG. 5, two opposite sides of the multilayer stack 114S7 are both covered by the dielectric layer 250 to be electrically insulated from two adjacent multilayer stacks 114S1 and 114S2.

Figure 5:
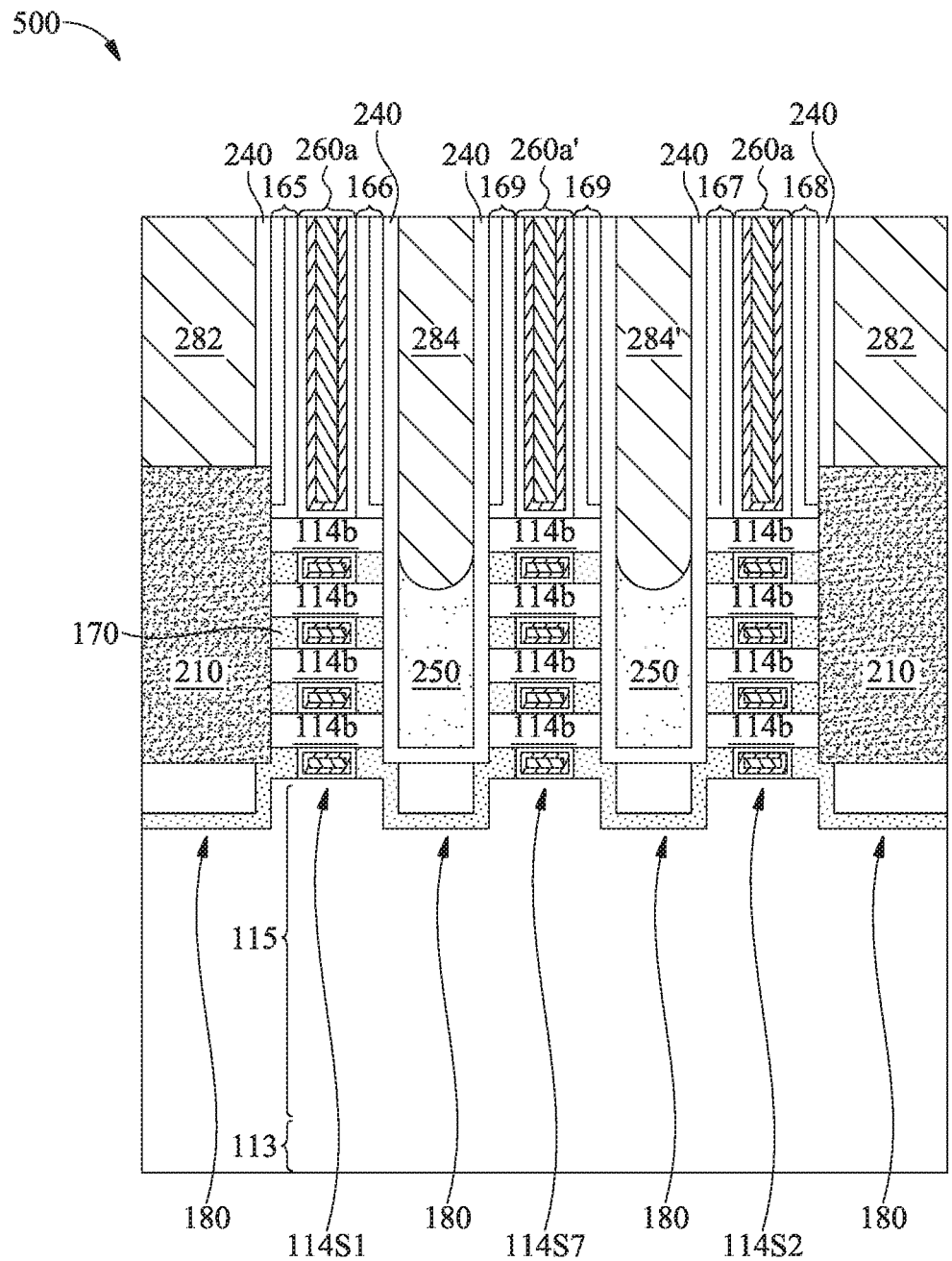
FIG. 5 is a cross-sectional view of a semiconductor device structure, in accordance with some embodiments.

FIG. 5 is a cross-sectional view of a semiconductor device structure 500, in accordance with some embodiments. As shown in FIG. 5, the semiconductor device structure 500 is similar to the semiconductor device structure 200 of FIG. 1M-2, except that the semiconductor device structure 500 further includes a gate stack 260*a*', spacers 169, the multilayer stack 114S7, and a contact structure 284', in accordance with some embodiments.

The gate stack 260*a*' is over and wraps around the multilayer stack 114S7, in accordance with some embodiments. The spacers 169 are on opposite sides of the gate stack 260*a*', in accordance with some embodiments. The spacers 169 are over the multilayer stack 114S7, in accordance with some embodiments. The gate stack 260*a*' is between the contact structures 284 and 284', in accordance with some embodiments. The dielectric layer 250 is on opposite sides of the multilayer stack 114S7 to electrically insulate the multilayer stack 114S7 from the multilayer stacks 114S1 and 114S2, in accordance with some embodiments.

Figure 6A:
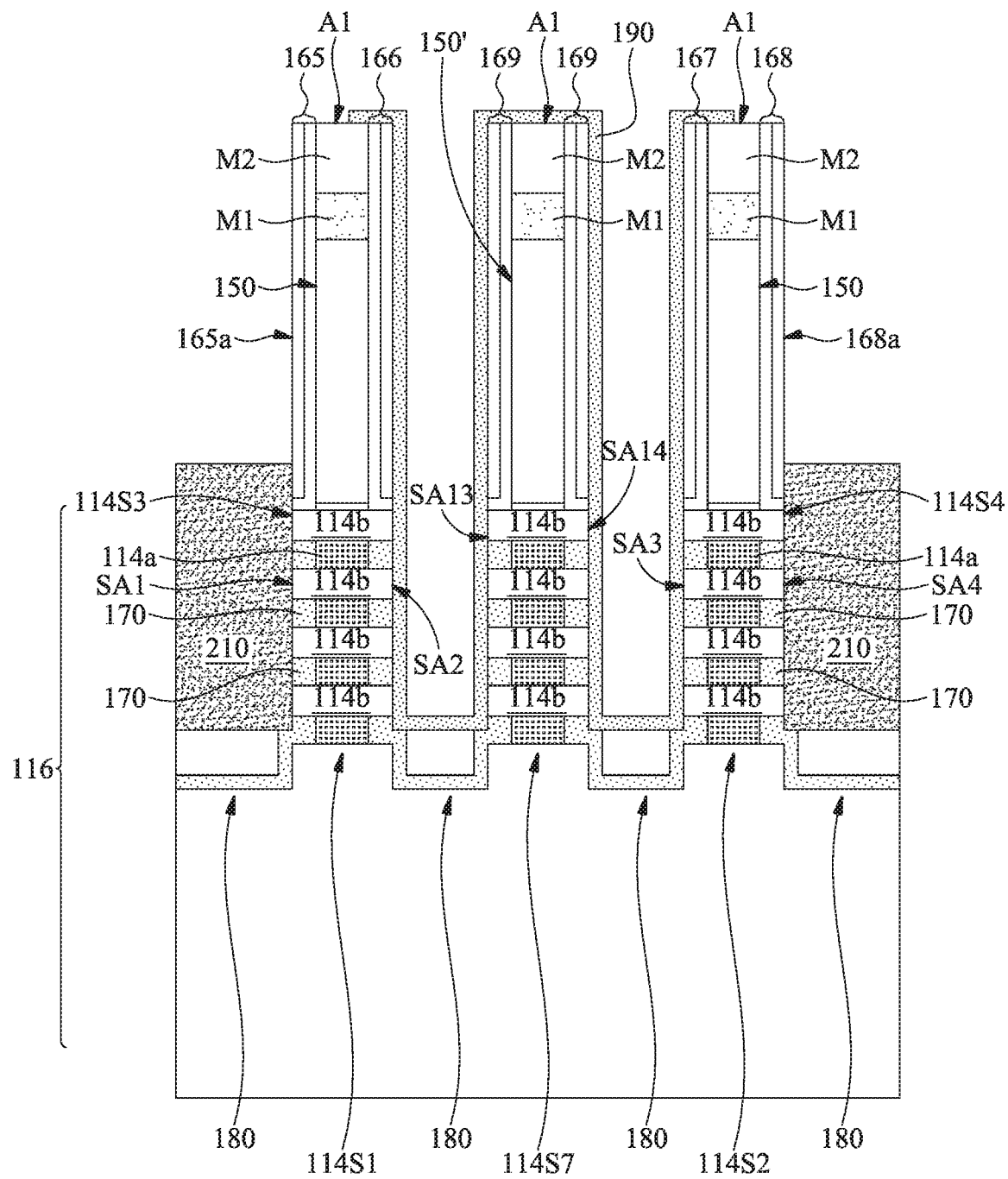
FIGS. 6A-6B are cross-sectional views of various stages of a process for forming the semiconductor device structure of FIG. 5, in accordance with some embodiments.
Figure 6B:
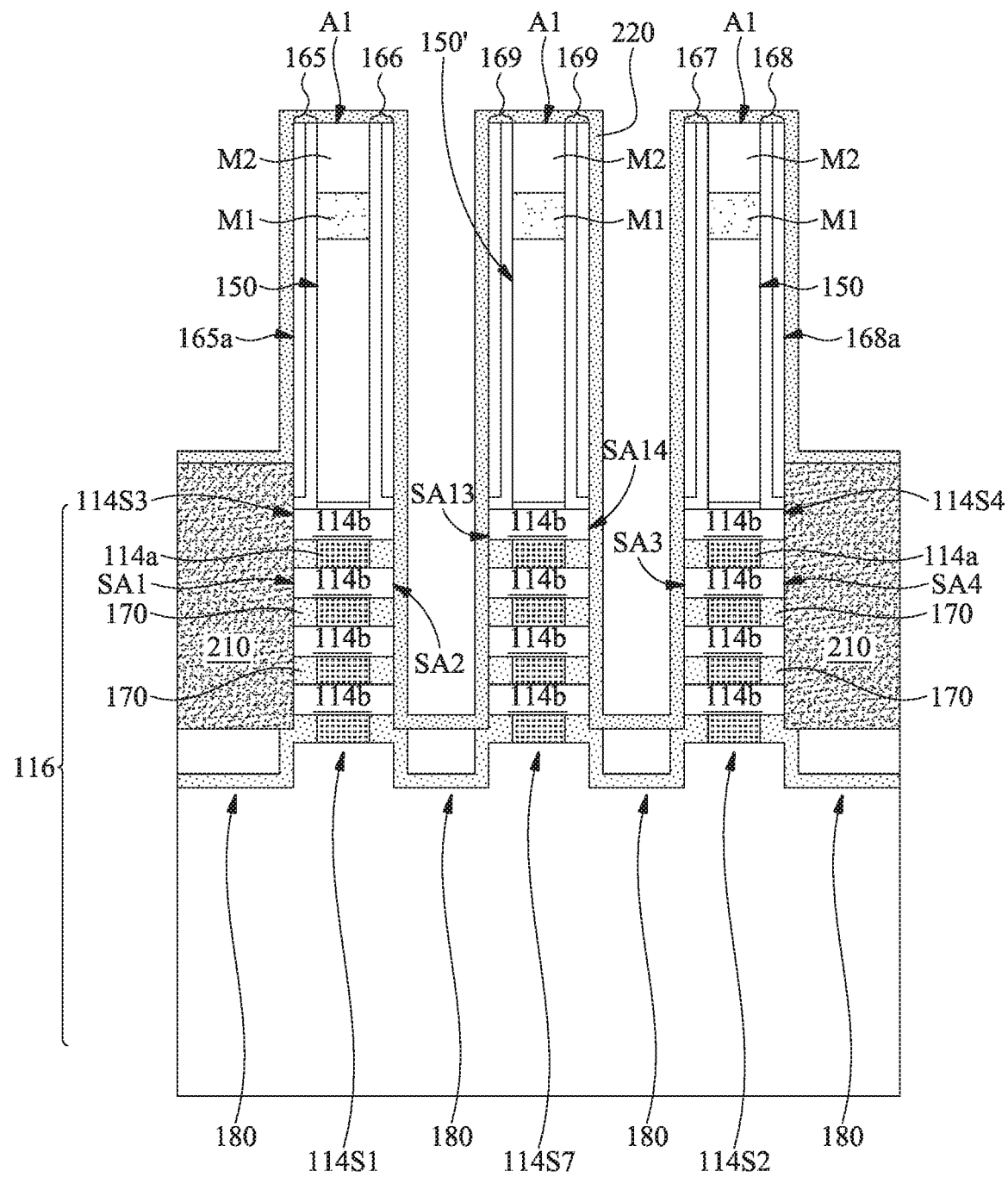

The forming method of the semiconductor device structure 500 is similar to the semiconductor device structure 200 of FIG. 1M-2, except that the mask layer 190 (as shown in FIG. 6A) further covers the opposite sidewalls SA13 and SA14 of the multilayer stack 114S7 while forming the stressors 210 to prevent the stressors 210 from being formed over the sidewalls SA13 and SA14, and the mask layer 220 (as shown in FIG. 6B) further covers the sidewalls SA13 and SA14 while forming the stressors 230 (as shown in FIG. 1H) to prevent the stressors 230 from being formed over the sidewalls SA13 and SA14, in accordance with some embodiments.

In FIGS. 6A and 6B, a gate stack 150' over the multilayer stack 114S7 wraps around the multilayer stack 114S7, in accordance with some embodiments. The forming methods, the materials, and the structures of the gate stack 260*a*', the spacers 169, the multilayer stack 114S7, and the contact structure 284' are similar to or substantially the same as the gate stack 260*a*, the spacers 165 and 166, the multilayer stack 114S1, and the contact structure 284 of FIG. 1M-2. The forming methods, the materials, and the structures of the gate stack 150' are similar to or substantially the same as the gate stack 150 of FIG. 1H, in accordance with some embodiments.

Figure 7A:
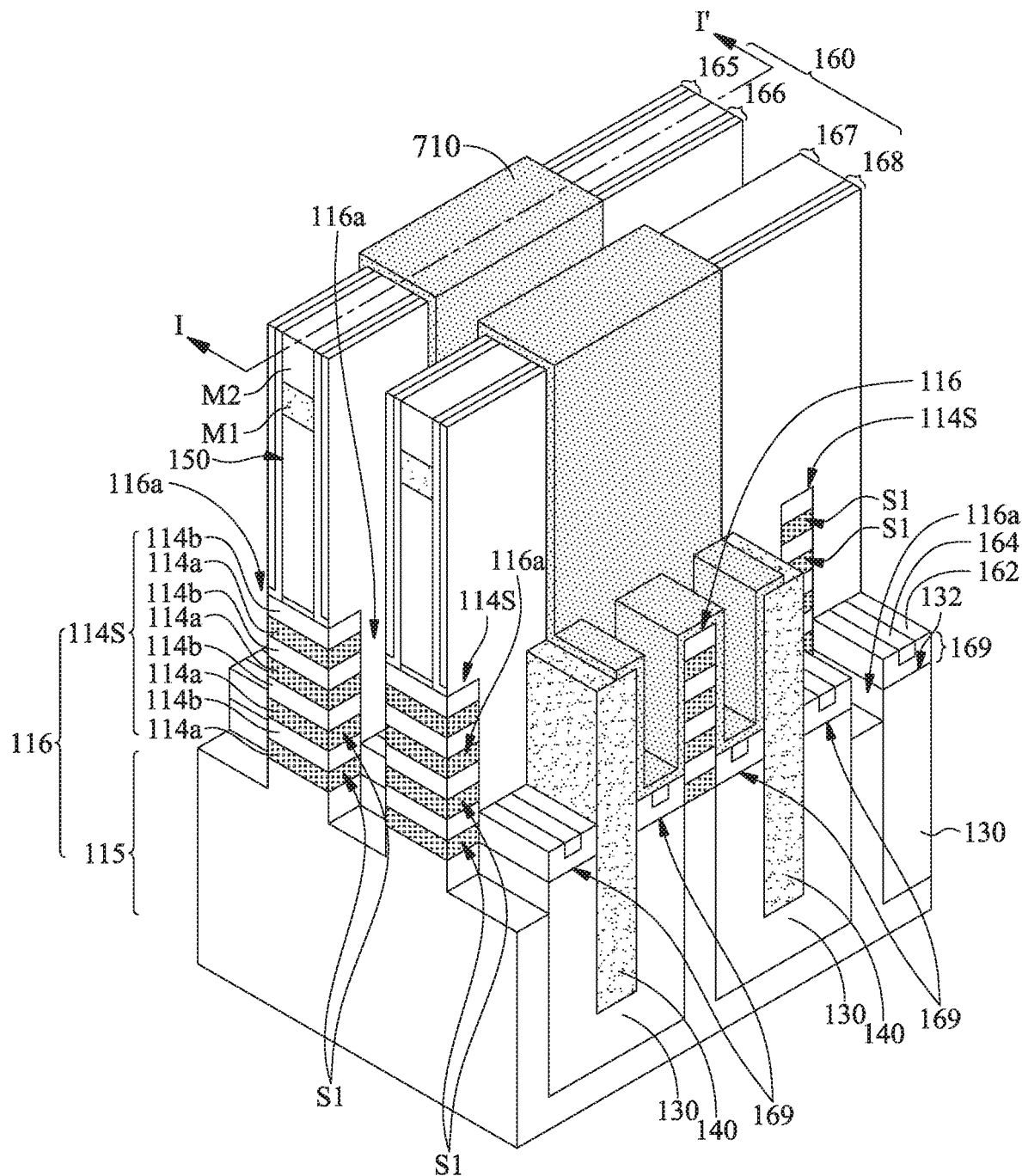
FIGS. 7A-7E are cross-sectional views of various stages of a process for forming a semiconductor device structure, in accordance with some embodiments.

FIGS. 7A-7E are cross-sectional views of various stages of a process for forming a semiconductor device structure, in accordance with some embodiments. After the step of FIG. 1D, as shown in FIG. 7A, portions of the spacer layer 160 are removed, in accordance with some embodiments. After the removal process, the spacer layer 160 remains over opposite sidewalls of the gate stacks 150, opposite sidewalls of the mask layers M1 and M2, and the top surfaces 132 of the dielectric layer 130, in accordance with some embodiments.

The spacer layer 160 remaining over the opposite sidewalls of the gate stacks 150 and the opposite sidewalls of the mask layers M1 and M2 forms spacers 165, 166, 167, and 168, in accordance with some embodiments. The spacer layer 160 remaining over the top surfaces 132 of the dielectric layer 130 forms spacers 169, in accordance with some embodiments.

Afterwards, as shown in FIG. 7A, a mask layer 710 is formed over the middle one of the fin structures 116, in accordance with some embodiments. The mask layer 710 covers the entire fin structure 116 thereunder, the spacers 169 adjacent to the fin structure 116 covered by the mask layer 710, portions of the spacer layer 160, and portions of the mask layer M2, in accordance with some embodiments.

Thereafter, as shown in FIG. 7A, upper portions of the fin structures 116, which are not covered by the mask layer 710, the gate stacks 150 and the spacer layer 160, are removed, in accordance with some embodiments. The removal process forms recesses 116*a* in the fin structures 116, in accordance with some embodiments. The multilayer structure 114 is divided into multilayer stacks 114S by the recesses 116*a*, in accordance with some embodiments. Each multilayer stack 114S includes four layers of the sacrificial layers 114*a* and four layers of the channel layers 114*b*, in accordance with some embodiments.

Figure 7B:
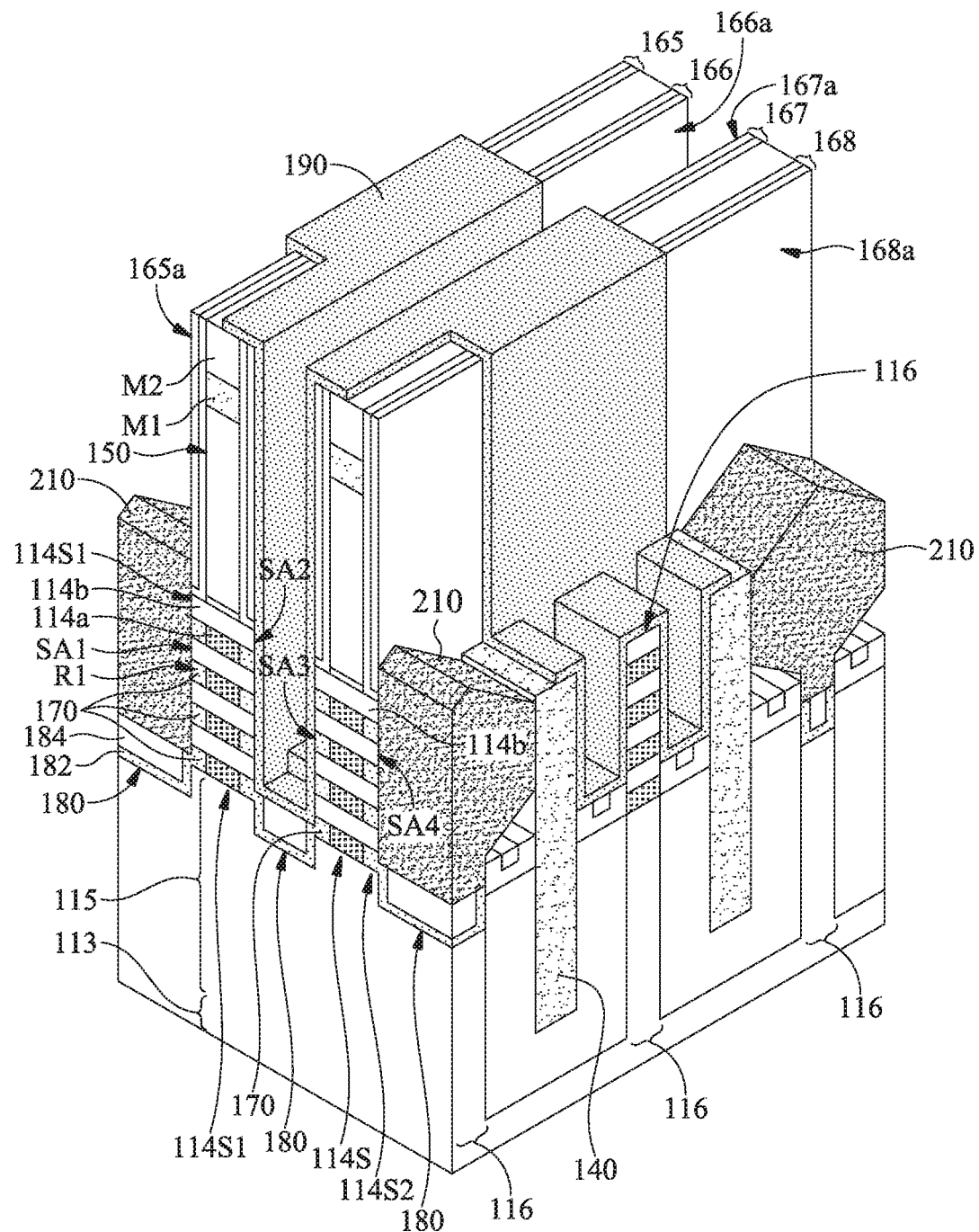

Afterwards, as shown in FIGS. 7A and 7B, portions of the sacrificial layers 114*a*, which are not covered by the mask layer 710, are removed from sidewalls S1 of the sacrificial layers 114*a* to form recesses R1 in the multilayer stacks 114S, in accordance with some embodiments. Each recess R1 is surrounded by the corresponding sacrificial layer 114*a* and the corresponding channel layers 114*b*, in accordance with some embodiments. The removal process includes an etching process, such as an isotropic etching process (e.g., a dry etching process or a wet etching process), in accordance with some embodiments.

Afterwards, as shown in FIGS. 7A and 7B, inner spacers 170 and bottom spacers 180 are respectively formed in the recesses R1 and 116a, in accordance with some embodiments. Each bottom spacer 180 includes layers 182 and 184, in accordance with some embodiments. The layer 184 is over the layer 182, in accordance with some embodiments. The layer 182 and the inner spacers 170 are formed from the same spacer material layer and therefore are made of the same material, in accordance with some embodiments.

The layers 182 and 184 are made of different materials, in accordance with some embodiments. In some embodiments, the layer 182 or 184 or the inner spacers 170 are made of an oxide-containing insulating material, such as silicon oxide. In some other embodiments, the layer 182 or 184 or the inner spacers 170 are made of a nitride-containing insulating material, such as silicon nitride (SiN), silicon oxynitride (SiON), silicon oxycarbonitride (SiOCN), or silicon carbonitride (SiCN).

Thereafter, as shown in FIG. 7B, the mask layer 710 is removed, in accordance with some embodiments. Afterwards, as shown in FIG. 7B, the step of FIG. 1G is performed to form the mask layer 190 and the stressors 210, in accordance with some embodiments. The mask layer 190 covers the middle one of the fin structures 116, the sidewall SA2 of the multilayer stack 114S1, and the sidewall SA3 of the multilayer stack 114S2, in accordance with some embodiments.

The formation positions, the materials, the structures, and the forming methods of the mask layer 190 and the stressors 210 of FIG. 7B are similar to or substantially the same as the mask layer 190 and the stressors 210 of FIG. 1G, in accordance with some embodiments.

Figure 7C:
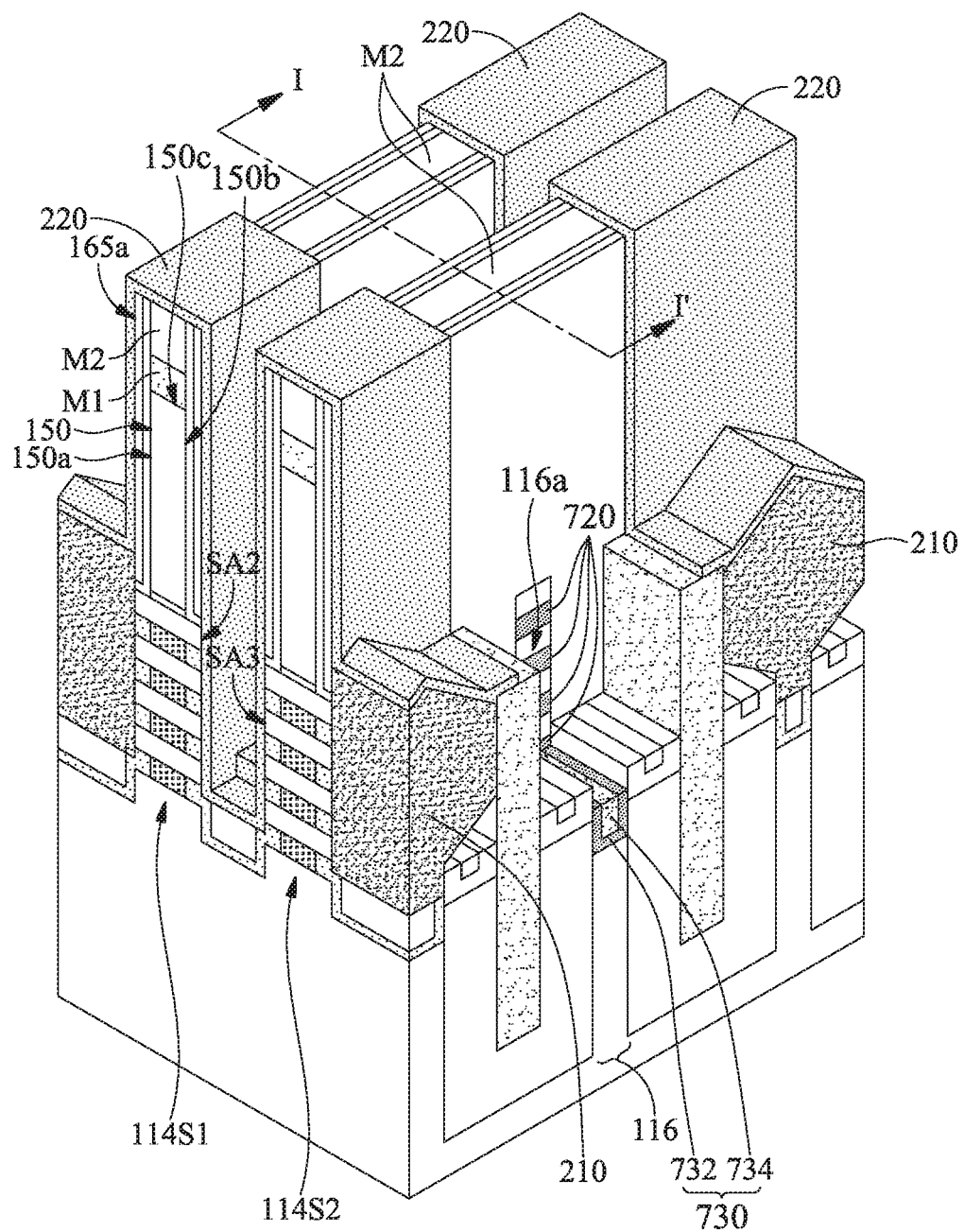
Figures 1, 7C:
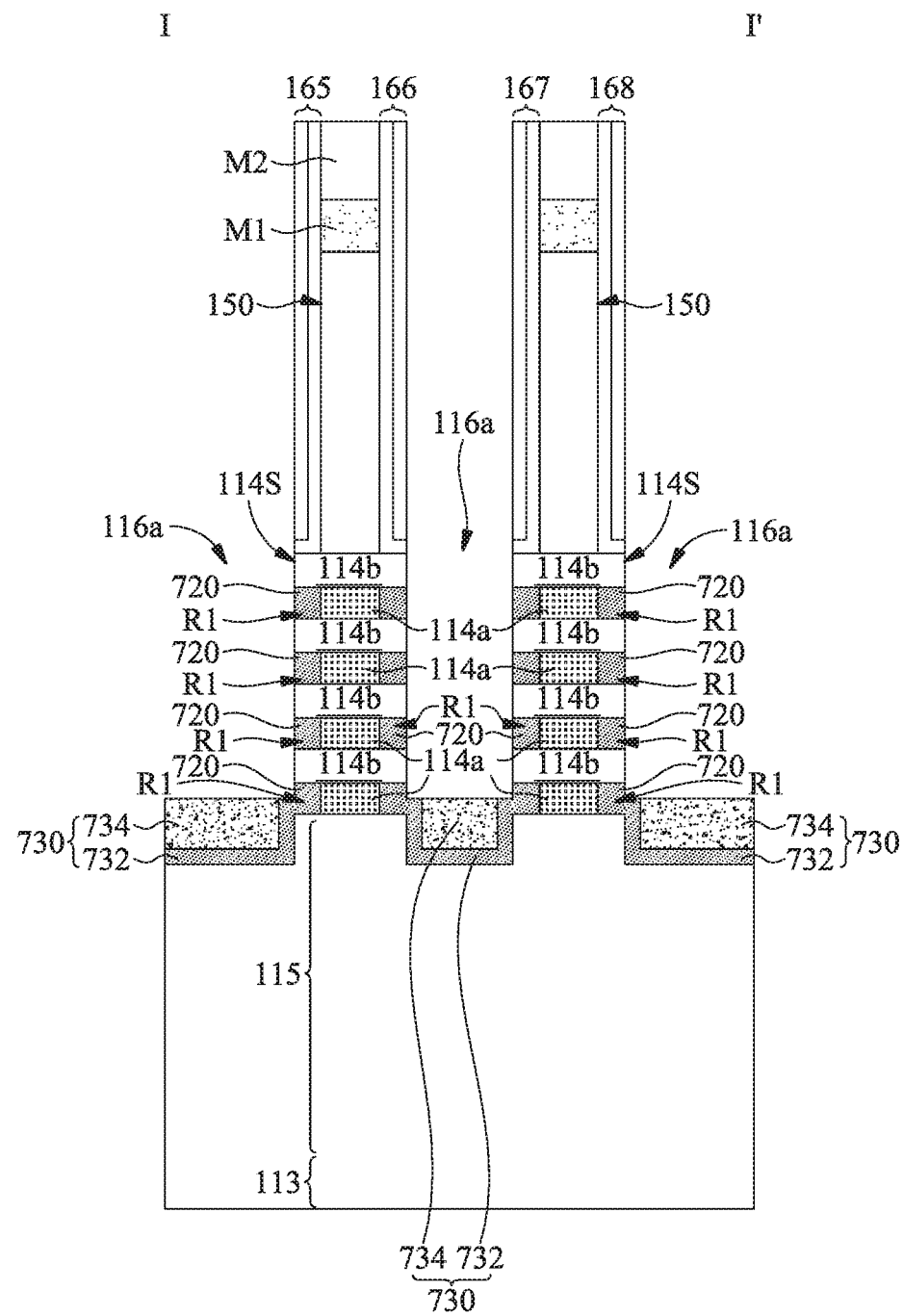

As shown in FIG. 7C, the mask layer 190 is removed, in accordance with some embodiments. As shown in FIG. 7C, a mask layer 220 is formed over the stressors 210, the sidewall SA2 of the multilayer stack 114S1, and the sidewall SA3 of the multilayer stack 114S2, in accordance with some embodiments. The mask layer 220 covers opposite sidewalls 150a and 150b and a top surface 150c of each gate stack 150, in accordance with some embodiments.

FIG. 7C-1 is a cross-sectional view illustrating the semiconductor device structure along a sectional line I-I' in FIG. 7C, in accordance with some embodiments. As shown in FIGS. 7C and 7C-1, upper portions of the fin structures 116, which are not covered by the mask layer 220, the gate stacks 150 and the spacer layer 160, are removed, in accordance with some embodiments.

The removal process forms recesses 116a in the fin structures 116, in accordance with some embodiments. The multilayer structure 114 is divided into multilayer stacks 114S by the recesses 116a, in accordance with some embodiments. Each multilayer stack 114S includes four layers of the sacrificial layers 114a and four layers of the channel layers 114b, in accordance with some embodiments.

Afterwards, as shown in FIGS. 7C and 7C-1, portions of the sacrificial layers 114a, which are not covered by the mask layer 220, are removed from sidewalls of the sacrificial layers 114a to form recesses R1 in the multilayer stacks 114S, in accordance with some embodiments. Each recess R1 is surrounded by the corresponding sacrificial layer 114a and the corresponding channel layers 114b, in accordance with some embodiments. The removal process includes an etching process, such as an isotropic etching process (e.g., a dry etching process or a wet etching process), in accordance with some embodiments.

Afterwards, as shown in FIGS. 7C and 7C-1, inner spacers 720 and bottom spacers 730 are respectively formed in the recesses R1 and 116a, in accordance with some embodiments. Each bottom spacer 730 includes layers 732 and 734, in accordance with some embodiments. The layer 734 is over the layer 732, in accordance with some embodiments. The layer 732 and the inner spacers 720 are formed from the same spacer material layer and therefore are made of the same material, in accordance with some embodiments.

The layers 732 and 734 are made of different materials, in accordance with some embodiments. In some embodiments, the layer 732 or 734 or the inner spacers 720 are made of an oxide-containing insulating material, such as silicon oxide. In some other embodiments, the layer 732 or 734 or the inner spacers 720 are made of a nitride-containing insulating material, such as silicon nitride (SiN), silicon oxynitride (SiON), silicon oxycarbonitride (SiOCN), or silicon carbonitride (SiCN).

Figure 7D:
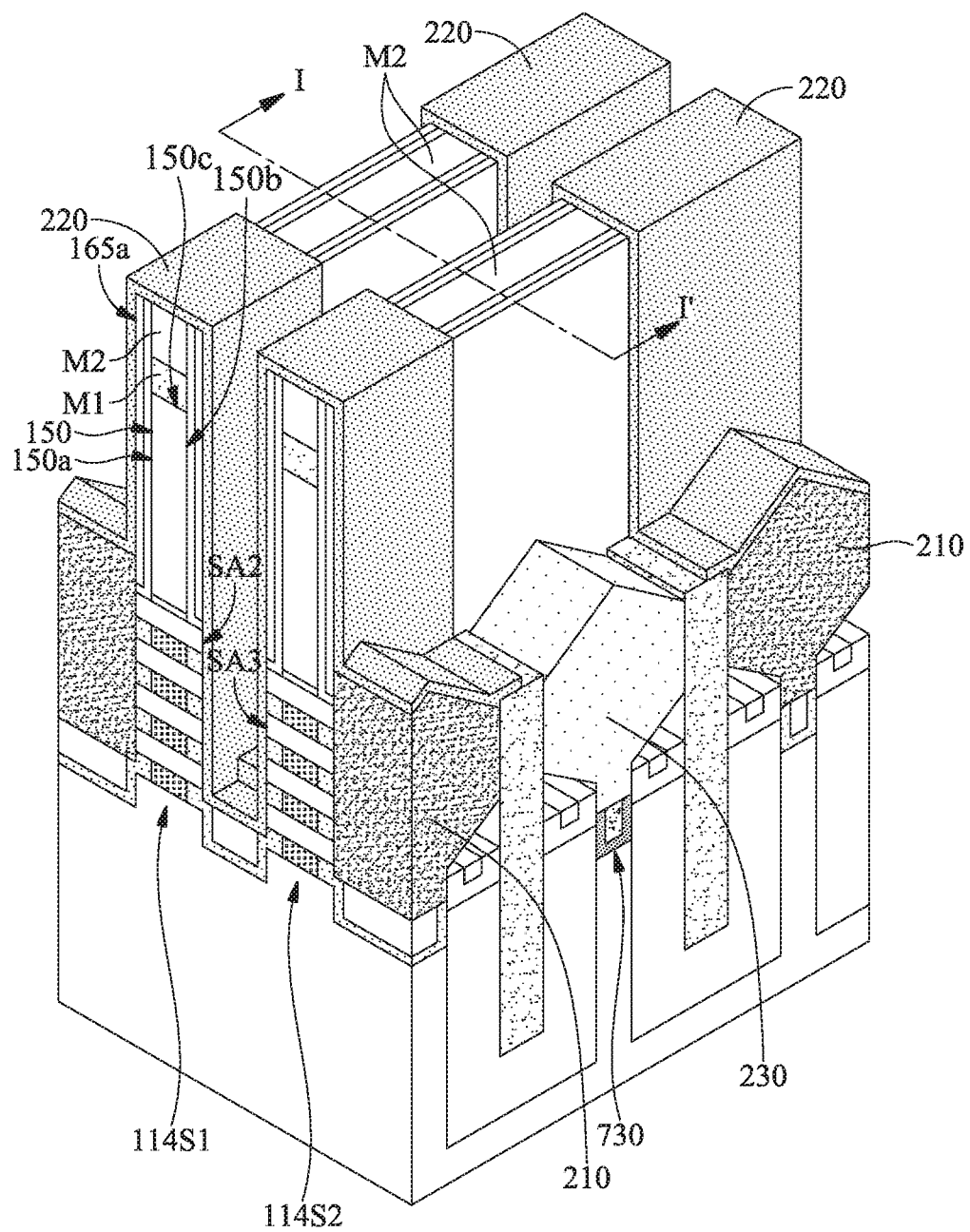
Figures 1, 7D:
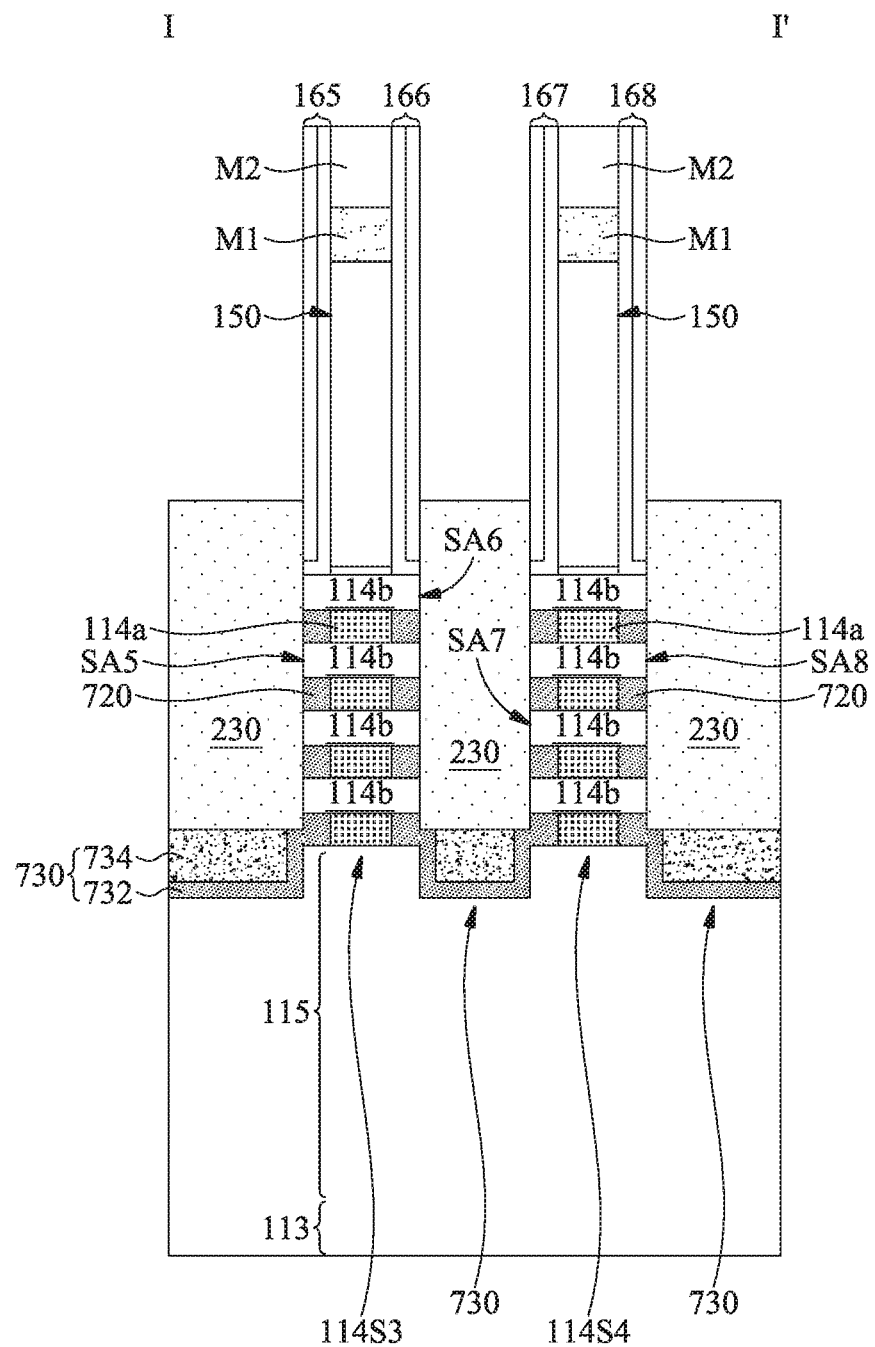

FIG. 7D-1 is a cross-sectional view illustrating the semiconductor device structure along a sectional line I-I' in FIG. 7D, in accordance with some embodiments. As shown in FIGS. 7D and 7D-1, stressors 230 are formed over the sidewalls SA5 and SA6 of the multilayer stack 114S3 and the sidewalls SA7 and SA8 of the multilayer stack 114S4, in accordance with some embodiments. In some embodiments, the stressors 230 are made of a semiconductor material (e.g., silicon) with N-type dopants, such as the Group VA element, in accordance with some embodiments. The Group VA element includes phosphor (P), antimony (Sb), or another suitable Group VA material.

In some other embodiments, the stressors 230 are made of a semiconductor material (e.g., silicon germanium) with P-type dopants, such as the Group IIIA element, in accordance with some embodiments. The Group IIIA element includes boron or another suitable material.

The stressors 210 and 230 are made of different materials, in accordance with some embodiments. For example, the stressors 210 are made of silicon germanium with P-type dopants, and the stressors 230 are made of silicon with N-type dopants. In some embodiments, the stressors 210 are made of silicon with N-type dopants, and the stressors 230 are made of silicon germanium with P-type dopants. The stressors 230 are formed using an epitaxial process, in accordance with some embodiments.

Figure 7E:
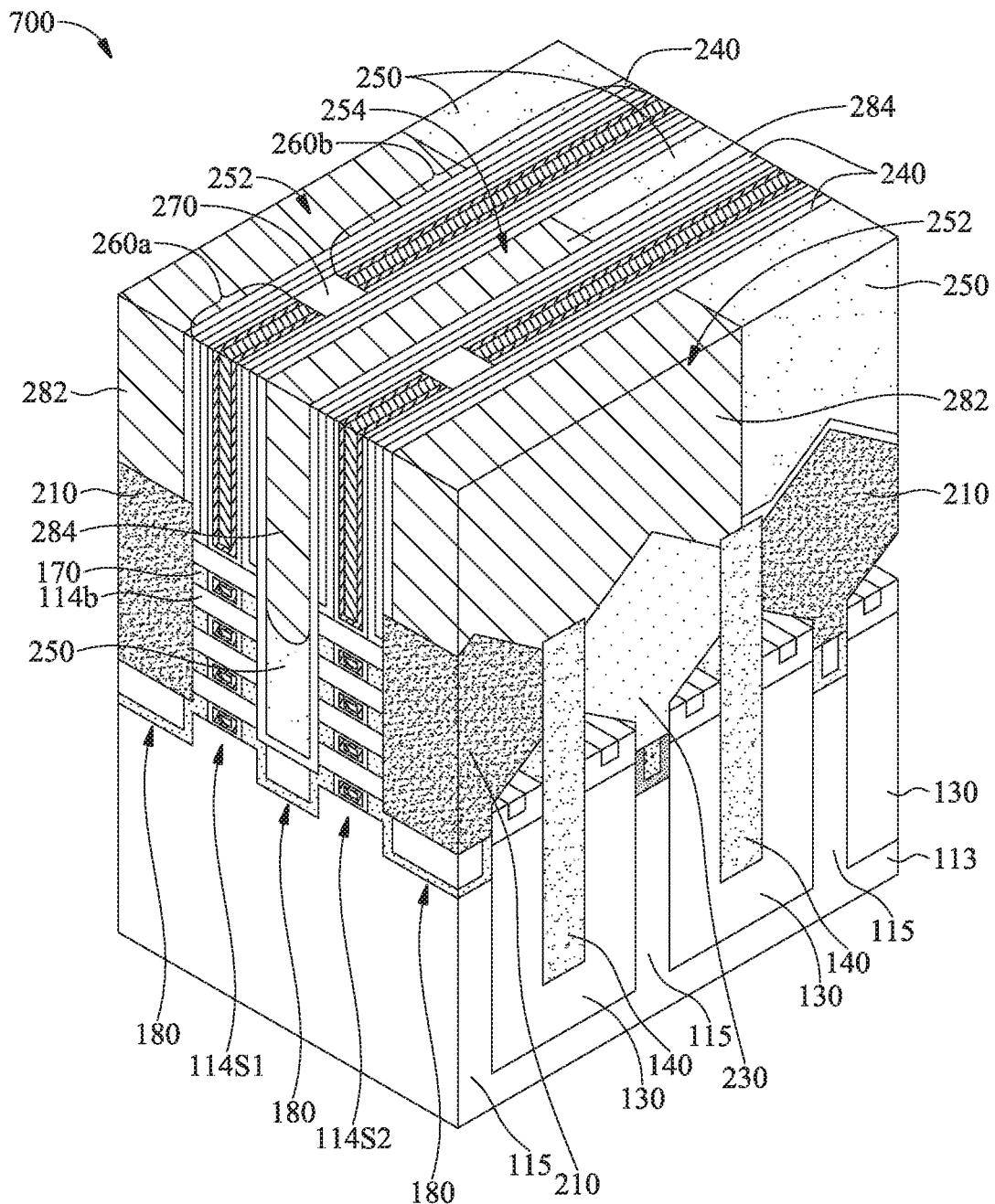

As shown in FIG. 7E, the mask layer 220 is removed, in accordance with some embodiments. Afterwards, as shown in FIG. 7E, the steps of FIGS. 1I-1M are performed, in accordance with some embodiments. In this step, a semiconductor device structure 700 is substantially formed, in accordance with some embodiments.

Processes and materials for forming the semiconductor structures of FIG. 2 to FIG. 7E may be similar to, or the same as, those for forming the semiconductor structure 200 described above.

In accordance with some embodiments, semiconductor device structures and methods for forming the same are provided. The methods (for forming the semiconductor device structure) form a stressor over one sidewall of the multilayer stack while a mask layer covers the other sidewall of the multilayer stack to prevent the stressor from being formed over the other sidewall. The methods remove the mask layer and form a dielectric layer over the other sidewall to electrically insulate the multilayer stack from an adjacent multilayer stack. The dielectric layer is self-aligned with the multilayer stack and a gate stack over the multilayer stack. Therefore, there is no need to maintain alignment accuracy between the dielectric layer and the multilayer stack (or the gate stack). Therefore, production cost is reduced, and the yield of the semiconductor device structures is improved.

In accordance with some embodiments, a method for forming a semiconductor device structure is provided. The method includes forming a first gate stack over a substrate. The substrate has a base and a first fin structure over the base, and the first gate stack wraps around a first upper portion of the first fin structure. The method includes partially removing the first fin structure, which is not covered by the first gate stack. The method includes forming a first mask layer over a first sidewall of the first fin structure. The method includes forming a first stressor over a second sidewall of the first fin structure while the first mask layer covers the first sidewall. The first sidewall is opposite to the second sidewall. The method includes removing the first mask layer. The method includes forming a dielectric layer over the base and the first stressor. The dielectric layer covers the first sidewall.

In accordance with some embodiments, a method for forming a semiconductor device structure is provided. The method includes forming a first gate stack and a second gate stack over a substrate. The substrate has a base, a first multilayer stack, and a second multilayer stack over the base. The first gate stack wraps around the first multilayer stack, and the second gate stack wraps around the second multilayer stack. The method includes forming a first mask layer over a first sidewall of the first multilayer stack. The method includes forming a first stressor over a second sidewall of the second multilayer stack while the first mask layer covers the first sidewall of the first multilayer stack. The method includes removing the first mask layer. The method includes forming a dielectric layer over the first stressor and the base. The dielectric layer covers the first sidewall.

In accordance with some embodiments, a semiconductor device structure is provided. The semiconductor device structure includes a substrate having a base and a first multilayer stack over the base. The semiconductor device structure includes a first gate stack over the substrate. The first gate stack wraps around the first multilayer stack. The semiconductor device structure includes a first spacer over a first sidewall of the first gate stack, wherein a second sidewall of the first spacer is substantially coplanar with a third sidewall of the first multilayer stack. The semiconductor device structure includes a dielectric layer over the base and covering the third sidewall. The semiconductor device structure includes a stressor over a fourth sidewall of the first multilayer stack. The third sidewall is opposite to the fourth sidewall.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a semiconductor device structure, comprising:
    forming a first gate stack over a substrate, wherein the substrate has a base and a first fin structure over the base, and the first gate stack wraps around a first upper portion of the first fin structure;
    partially removing the first fin structure, which is not covered by the first gate stack;
    forming a first mask layer over a first sidewall of the first fin structure;
    forming a first stressor over a second sidewall of the first fin structure while the first mask layer covers the first sidewall, wherein the first sidewall is opposite to the second sidewall;
    removing the first mask layer; and
    forming a dielectric layer over the base and the first stressor, wherein the dielectric layer covers the first sidewall.

2. The method for forming the semiconductor device structure as claimed in claim 1, wherein the first fin structure and a lower portion of the first gate stack are between the first stressor and the first mask layer.

3. The method for forming the semiconductor device structure as claimed in claim 1, wherein the substrate further has a second fin structure over the base, the first gate stack wraps around a second upper portion of the second fin structure,
    the method further comprises:
    partially removing the second fin structure, which is not covered by the first gate stack, during partially removing the first fin structure, which is not covered by the first gate stack, wherein
    the first mask layer is further formed over a third sidewall and a fourth sidewall of the second fin structure, the third sidewall is opposite to the fourth sidewall, and the first stressor is formed over the second sidewall of the first fin structure while the first mask layer covers the third sidewall and the fourth sidewall.

4. The method for forming the semiconductor device structure as claimed in claim 3, further comprising:
    forming a second mask layer over the first sidewall of the first fin structure and the first stressor after removing the first mask layer and before forming the dielectric layer over the base and the first stressor;
    forming a second stressor and a third stressor respectively over the third sidewall and the fourth sidewall of the second fin structure while the second mask layer covers the first sidewall and the first stressor; and
    removing the second mask layer before forming the dielectric layer over the base and the first stressor.

5. The method for forming the semiconductor device structure as claimed in claim 4, wherein the second mask layer covers a fifth sidewall, a sixth sidewall, and a top surface of the first gate stack, and the fifth sidewall and the sixth sidewall are respectively over the first sidewall and the second sidewall.

6. The method for forming the semiconductor device structure as claimed in claim 4, wherein the first stressor and the second stressor are made of different materials.

7. The method for forming the semiconductor device structure as claimed in claim 1, wherein the substrate further has a second fin structure over the base, the first gate stack wraps around a second upper portion of the second fin structure,
    the method further comprises:
    forming a second mask layer over the second fin structure;

partially removing the first fin structure, which is not covered by the first gate stack, so that the second mask layer remains covering the second fin structure; and removing the second mask layer after partially removing the first fin structure, which is not covered by the first gate stack, wherein the first mask layer covers the second fin structure.

8. The method for forming the semiconductor device structure as claimed in claim 7, further comprising:

forming a third mask layer over the first sidewall of the first fin structure and the first stressor after removing the first mask layer and before forming the dielectric layer over the base and the first stressor; and partially removing the second fin structure, which is not covered by the first gate stack, while the third mask layer covers the first sidewall and the first stressor.

9. The method for forming the semiconductor device structure as claimed in claim 8, further comprising:

forming a second stressor and a third stressor respectively over a third sidewall and a fourth sidewall of the second fin structure after partially removing the second fin structure, which is not covered by the first gate stack; and removing the third mask layer before forming the dielectric layer over the base and the first stressor.

10. The method for forming the semiconductor device structure as claimed in claim 1, further comprising:

forming a first bottom spacer and a second bottom spacer over the base and on opposite sides of the first fin structure after partially removing the first fin structure and before forming the first mask layer over the first sidewall of the first fin structure, wherein the first bottom spacer and the second bottom spacer are respectively adjacent to the first sidewall and the second sidewall, and the first stressor is over the second bottom spacer.

11. The method for forming the semiconductor device structure as claimed in claim 10, wherein the first mask layer covers the first bottom spacer.

12. A method for forming a semiconductor device structure, comprising:

forming a first gate stack and a second gate stack over a substrate, wherein the substrate has a base, a first multilayer stack, and a second multilayer stack over the base, the first gate stack wraps around the first multilayer stack, and the second gate stack wraps around the second multilayer stack;

forming a first mask layer over a first sidewall of the first multilayer stack;

forming a first stressor over a second sidewall of the second multilayer stack while the first mask layer covers the first sidewall of the first multilayer stack;

removing the first mask layer; and forming a dielectric layer over the first stressor and the base, wherein the dielectric layer covers the first sidewall.

13. The method for forming the semiconductor device structure as claimed in claim 12, wherein the first mask layer is further formed over a third sidewall of the second multilayer stack, the first stressor is formed while the first mask layer covers the first sidewall and the third sidewall, and the dielectric layer further covers the third sidewall.

14. The method for forming the semiconductor device structure as claimed in claim 13, wherein the first sidewall and the third sidewall face each other, and the first mask layer continuously covers the first sidewall and the third sidewall.

15. The method for forming the semiconductor device structure as claimed in claim 14, wherein the first mask layer is further formed over a fourth sidewall of the first multilayer stack, the first stressor is formed while the first mask layer covers the first sidewall, the third sidewall, and the fourth sidewall, the dielectric layer further covers the fourth sidewall, and the first sidewall is opposite to the fourth sidewall.

16. A method for forming a semiconductor device structure, comprising:

forming a first gate stack and a second gate stack over a substrate, wherein the substrate has a base, a first multilayer stack, and a second multilayer stack over the base, the first multilayer stack and the second multilayer stack are separated by a gap, the first gate stack wraps around the first multilayer stack, and the second gate stack wraps around the second multilayer stack;

forming a mask layer in the gap;

forming a first stressor over a first sidewall of the first multilayer stack while the mask layer is in the gap, wherein the first sidewall faces away from the gap;

removing the mask layer; and forming a dielectric layer partially over the first stressor and partially in the gap, wherein the dielectric layer in the gap covers a second sidewall of the first multilayer stack, and the second sidewall is opposite to the first sidewall.

17. The method for forming the semiconductor device structure as claimed in claim 16, further comprising:

forming a second stressor over a third sidewall of the second multilayer stack while the mask layer is in the gap, wherein the third sidewall faces away from the gap.

18. The method for forming the semiconductor device structure as claimed in claim 17, wherein the dielectric layer in the gap further covers a fourth sidewall of the second multilayer stack, and the fourth sidewall is opposite to the third sidewall.

19. The method for forming the semiconductor device structure as claimed in claim 18, wherein the mask layer continuously covers the second sidewall of the first multilayer stack and the fourth sidewall of the second multilayer stack.

20. The method for forming the semiconductor device structure as claimed in claim 16, wherein the mask layer covers a third sidewall of the first gate stack and a fourth sidewall of the second gate stack, and the third sidewall and the fourth sidewall face each other.

* * * * *